US010755788B2

(12) United States Patent
Rabkin et al.

(10) Patent No.: US 10,755,788 B2
(45) Date of Patent: *Aug. 25, 2020

(54) IMPEDANCE MISMATCH MITIGATION SCHEME THAT APPLIES ASYMMETRIC VOLTAGE PULSES TO COMPENSATE FOR ASYMMETRIES FROM APPLYING SYMMETRIC VOLTAGE PULSES

(71) Applicant: SanDisk Technologies LLC, Addison, TX (US)

(72) Inventors: Peter Rabkin, Cupertino, CA (US); Kwang-Ho Kim, Pleasanton, CA (US); Masaaki Higashitani, Cupertino, CA (US); Yingda Dong, Los Altos, CA (US)

(73) Assignee: SanDisk Technologies LLC, Addison, TX (US)

( * ) Notice: Subject to any disclaimer, the term of this patent is extended or adjusted under 35 U.S.C. 154(b) by 7 days.

This patent is subject to a terminal disclaimer.

(21) Appl. No.: 16/233,780

(22) Filed: Dec. 27, 2018

(65) Prior Publication Data

US 2020/0143889 A1 May 7, 2020

Related U.S. Application Data

(63) Continuation-in-part of application No. 16/182,031, filed on Nov. 6, 2018, now Pat. No. 10,650,898.

(51) Int. Cl.
*G11C 16/14* (2006.01)
*G11C 16/04* (2006.01)
*G11C 16/34* (2006.01)
*H01L 27/1157* (2017.01)
*H01L 27/11524* (2017.01)

(52) U.S. Cl.
CPC .......... *G11C 16/14* (2013.01); *G11C 16/0483* (2013.01); *G11C 16/3445* (2013.01); *H01L 27/1157* (2013.01); *H01L 27/11524* (2013.01)

(58) Field of Classification Search
None
See application file for complete search history.

(56) References Cited

U.S. PATENT DOCUMENTS

| 5,798,966 | A  | 8/1998  | Keeney      |
| 7,444,535 | B2 | 10/2008 | Hsieh et al.|
| 8,638,608 | B2 | 1/2014  | Lai et al.  |

(Continued)

OTHER PUBLICATIONS

Respose to non-final Office Action dated Dec. 20, 2019, U.S. Appl. No. 16/182,031, filed Nov. 6, 2018.

(Continued)

*Primary Examiner* — J. H. Hur
(74) *Attorney, Agent, or Firm* — Vierra Magen Marcus LLP

(57) ABSTRACT

An apparatus comprising an impedance compensation circuit is disclosed. The impedance compensation circuit compensates for impedance differences between a first pathway connected to a first transistor and a second pathway connected to a second transistor. However, rather than making a compensation based on a signal (e.g., voltage) applied to either the first or the second pathway, a compensation is made based on the signals (e.g., voltage pulses) applied to third and fourth pathways connected to the transistors.

20 Claims, 23 Drawing Sheets

(56) References Cited

U.S. PATENT DOCUMENTS

| | | | |
|---|---|---|---|
| 8,902,658 B1 * | 12/2014 | Raghu | G11C 11/5635 365/185.13 |
| 9,087,601 B2 | 7/2015 | Dutta et al. | |
| 9,236,139 B1 | 1/2016 | Lai et al. | |
| 9,343,160 B1 | 5/2016 | Dutta et al. | |
| 9,640,273 B1 | 5/2017 | Chen et al. | |
| 9,887,002 B1 | 2/2018 | Zhang et al. | |
| 9,917,100 B2 | 3/2018 | Zhang et al. | |
| 2011/0110153 A1 | 5/2011 | Dutta et al. | |
| 2012/0243314 A1 | 9/2012 | Maeda | |
| 2013/0107628 A1 | 5/2013 | Dong et al. | |
| 2013/0279257 A1 | 10/2013 | Costa et al. | |
| 2014/0043907 A1 | 2/2014 | Fujimura | |
| 2014/0043916 A1 | 2/2014 | Costa et al. | |
| 2014/0226414 A1 | 8/2014 | Costa et al. | |
| 2016/0049201 A1 | 2/2016 | Lue et al. | |
| 2016/0148691 A1 | 5/2016 | Rabkin et al. | |

OTHER PUBLICATIONS

U.S. Appl. No. 16/400,280, filed May 1, 2019 by Rabkin et al.
Non-final Office Action dated Oct. 16, 2019, U.S. Appl. No. 16/182,031, filed Nov. 6, 2018.
U.S. Appl. No. 16/182,031, filed Nov. 6, 2018 by Rabkin et al.
Notice of Allowance dated Mar. 11, 2020, U.S. Appl. No. 16/182,031, filed Nov. 6, 2018.

* cited by examiner

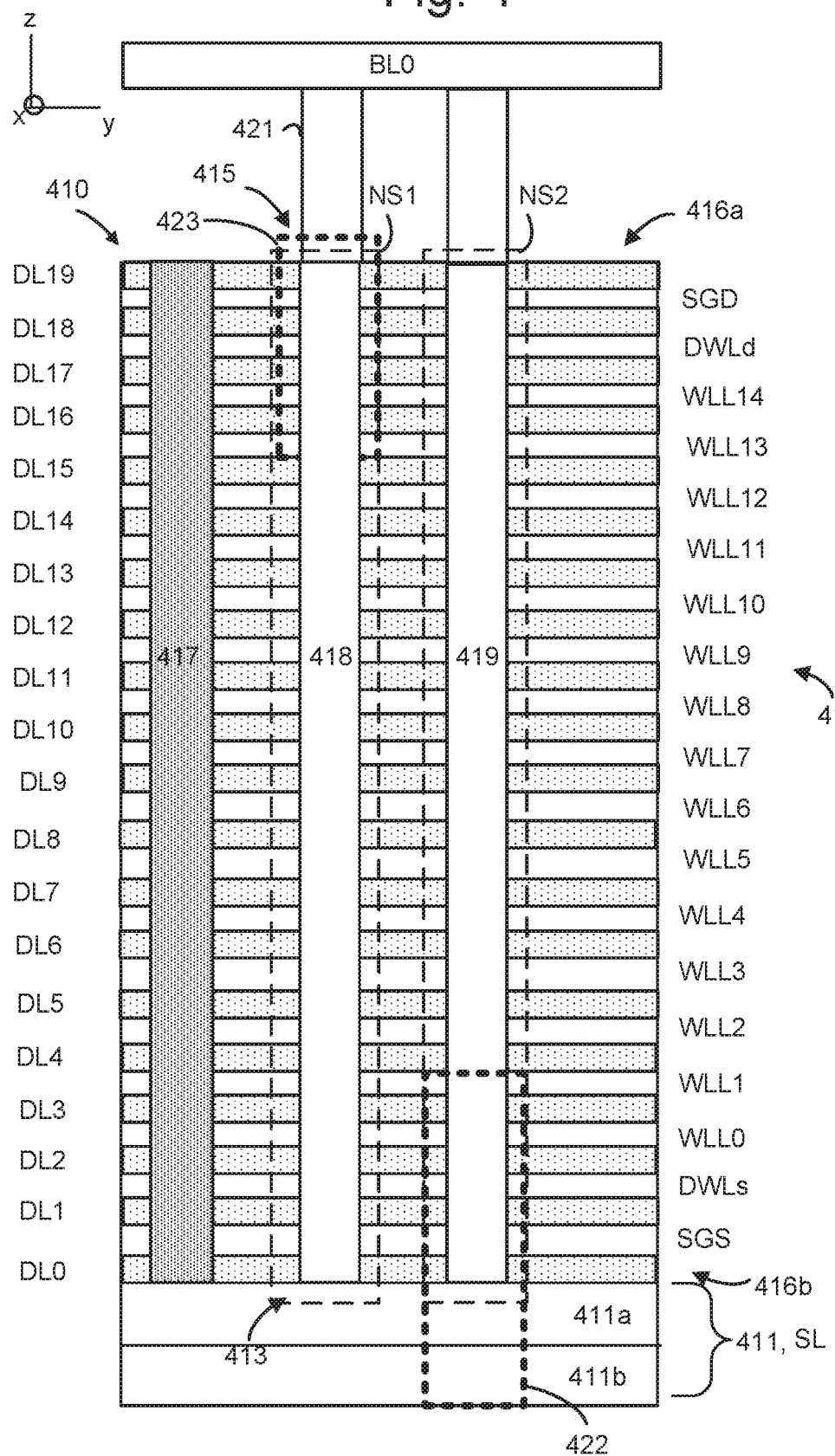

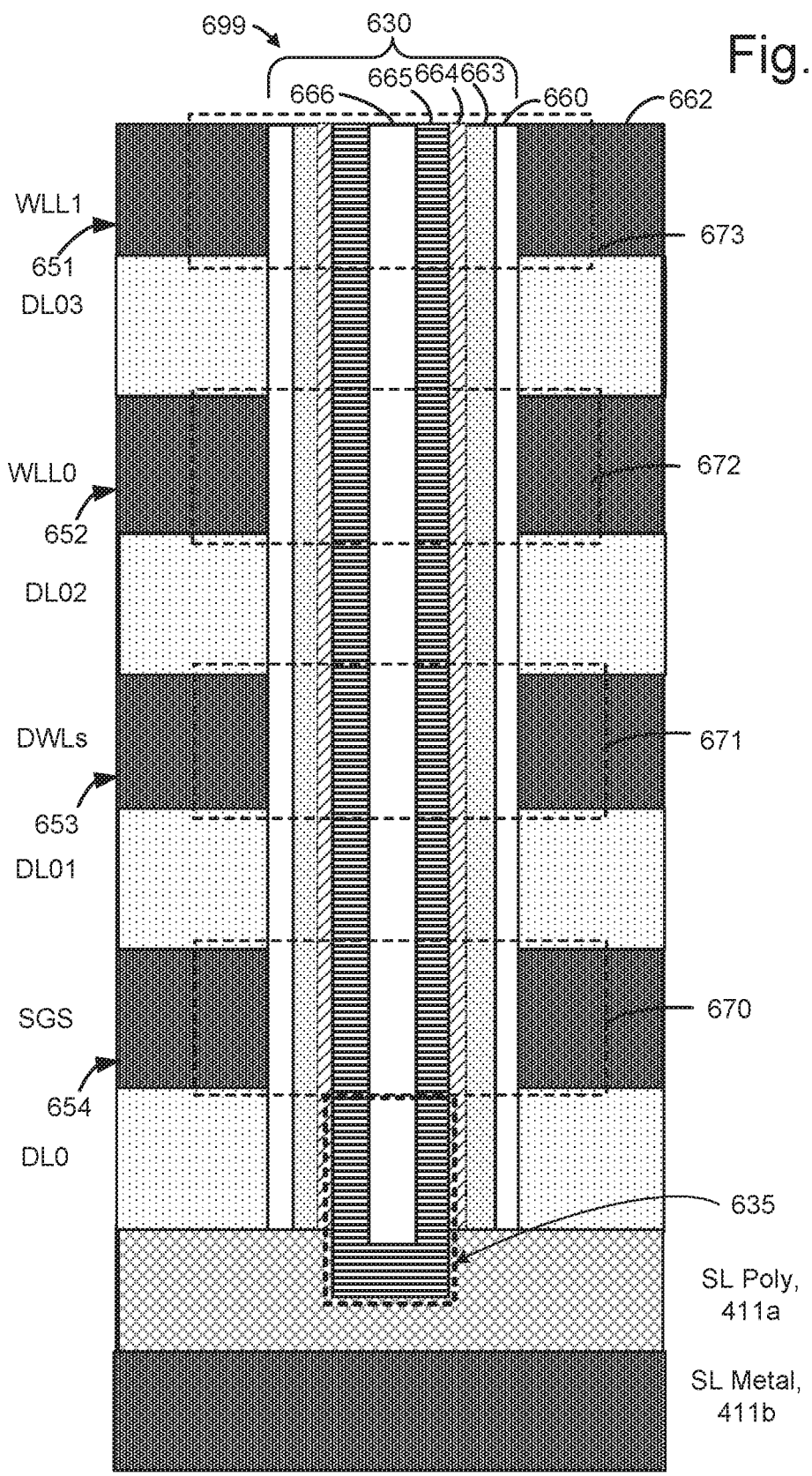

2000

Apply voltages having substantially the same magnitude to first and second pathways connected to first terminals of first and second transistors, 2002

Apply voltages having different magnitudes to third and fourth pathways connected to second terminals of the first and second transistors to result in substantially the same voltage between the first terminal and the second terminal of the first transistor and the second transistor, 2004

Apply symmetric voltage pulses to first and second pathways that result in asymmetric voltage pulses at first and second transistors connected to the first and second pathways, 2102

Apply asymmetric voltage pulses to third and fourth pathways connected to the first and second transistors that result in the voltage pulses between first and second terminals of the first and second transistors having substantially the same steady state magnitudes, 2104

FIG. 21

IMPEDANCE MISMATCH MITIGATION SCHEME THAT APPLIES ASYMMETRIC VOLTAGE PULSES TO COMPENSATE FOR ASYMMETRIES FROM APPLYING SYMMETRIC VOLTAGE PULSES

CLAIM OF PRIORITY

This application is a continuation-in-part of U.S. patent application Ser. No. 16/182,031, entitled "ERASE OPERATION IN 3D NAND," by Rabkin et al., filed Nov. 6, 2018, published as U.S. 2020/143888 on May 7, 2020 and issued as U.S. Pat. No. 10,650,898 on May 12, 2020, incorporated by reference herein in its entirety.

BACKGROUND

A pathway may be used to provide a signal (e.g., voltage pulse) to an electrical component such as a transistor. A pathway may include an electrically conductive path. A pathway may include a wire, trace, transmission line, track, pad, layer, lead, metal, portion of a printed circuit board or assembly, conducting material and other material that may transfer or carry an electrical signal.

Impedance mismatches can occur between different pathways in an electrical circuit. An impedance mismatch between two pathways can result in different voltage drops along the two pathways. An impedance mismatch between two pathways can result in different RC (resistance-capacitance) delays along the two pathways.

BRIEF DESCRIPTION OF THE DRAWINGS

Like-numbered elements refer to common components in the different figures.

FIG. 4 depicts an example cross-sectional view of a portion of one of the blocks of FIG. 3.
FIG. 5 depicts an example transistor 590.
FIG. 6A depicts a close-up view of the region 422 of the stack of FIG. 4.
FIG. 20 is a flowchart of one embodiment of a process of mitigating for impedance mismatch between pathways.
FIG. 21 is a flowchart of one embodiment of a process of mitigating for impedance mismatch between pathways.

DETAILED DESCRIPTION

Figure 1:
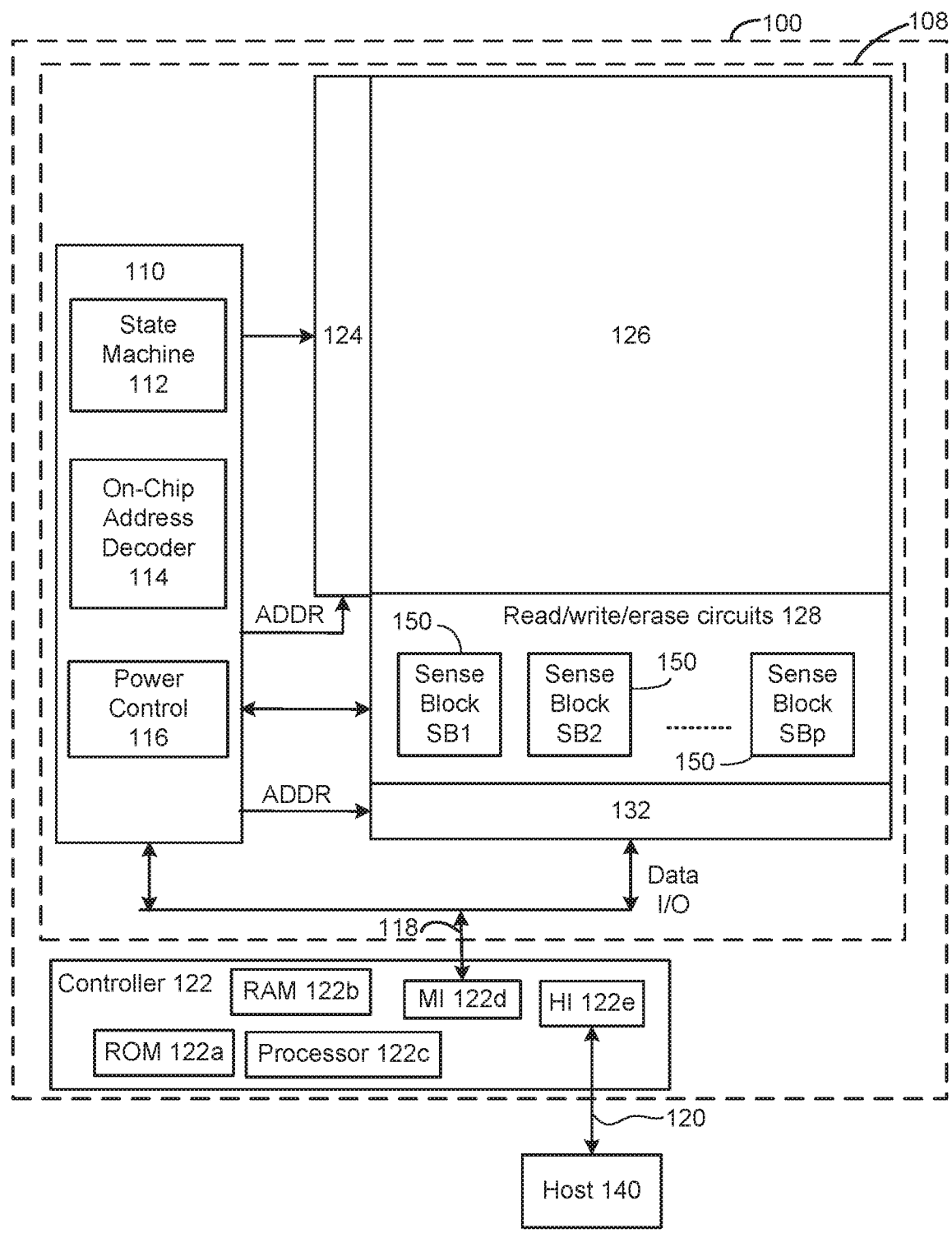
FIG. 1 is a functional block diagram of a memory device.

Techniques are provided for compensating for impedance differences in different pathways. Herein, a "pathway" is any tangible medium capable of transmitting an electrical signal (e.g., a voltage pulse or a current pulse) along the pathway. Techniques are provided to compensate for impedance differences between a first pathway connected to a first transistor and a second pathway connected to a second transistor. However, rather than making a compensation based on a signal (e.g., voltage) applied to the first and/or the second pathway, a compensation is made based on the signals (e.g., voltage pulses) applied to third and fourth pathways connected to the transistors, in one embodiment. In one embodiment, the voltage pulses applied to the third and fourth pathways have different steady state magnitudes in order to compensate for different impedances of the first and second pathways. The technique may be used, for example, to create substantially the same gate-to-drain voltage or the substantially the same gate-to-source voltage across two transistors. The technique may be applied, for example, when it is not possible, or undesirable, to make a compensation based on the voltages applied to the first and second pathways. For example, in some cases, the same voltage pulse might be applied to both the first and second pathways. However, it is not a requirement that the same voltage pulse be applied to the first and second pathways.

In one embodiment, the first pathway includes a bit line connected to a terminal (e.g., "bit line terminal") of a first select transistor on a NAND string, the second pathway includes a source line connected to a terminal (e.g., "source line terminal") of a second select transistor on the NAND string, the third pathway includes a first select line connected to a control terminal (e.g., gate terminal) of the first select transistor, and the fourth pathway includes a second select line connected to a control terminal (e.g., gate terminal) of the second select transistor. The first and second pathways have different impedances, in one embodiment. For example, the bit line and the source line might have different impedances. The voltage pulses applied to the first and second pathways have substantially the same magnitude and substantially the same start time, in one embodiment. However, due to the different pathway impedances, the voltage magnitudes and/or start times are different at the terminals of the select transistors connected to the bit line and source line, in one embodiment. The voltages that are applied to the first and second select lines are used to compensate for the different voltage magnitudes and/or start times at the terminals of the select transistors connected to the bit line and source line, in one embodiment. This results in substantially the same magnitude for the gate terminal to bit line terminal voltage for the first select transistor and the gate terminal to source line terminal voltage for the second select transistor, in one embodiment. In one embodiment, this results in substantially the same magnitude gate induced drain leakage (GIDL) voltage across the two select transistors. As will be further discussed below, a GIDL voltage is a drain to gate voltage that triggers a GIDL current in a transistor. In one embodiment, this results in substantially the same magnitude gate induced drain leakage (GIDL) current in the two select transistors. The GIDL currents are used in a two-sided GIDL erase, in one embodiment.

As is well understood, a voltage is a difference in electric potential between two points. Note that herein, when the term "voltage" is used with reference to a point in a circuit (such as a bit line voltage), it will be understood that this is referring to the difference in electric potential between the specified point and some common point in the circuit (e.g., ground) without the need to make specific reference to the common point. In some cases, the term voltage will be used with reference to two points (e.g., the gate terminal and the bit line terminal of a transistor). In this case, the voltage is the difference in electric potential between the two specified points.

One technique to erase memory cells in some memory devices is to bias a p-well substrate to a high voltage to charge up a NAND channel. An erase enable voltage is applied to control gates of memory cells while the NAND channel is at a high voltage to erase the non-volatile storage elements (memory cells). Another approach to erasing memory cells is to generate gate induced drain leakage (GIDL) current to charge up the NAND string channel. An erase enable voltage is applied to control gates of the memory cells, while maintaining the string channel potential to erase the memory cells.

The GIDL current is generated by causing a drain-to-gate voltage at a select transistor, in one embodiment. A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to a bit line to generate a first GIDL current. A second GIDL voltage may be created between two terminals of a select transistor (e.g., source side select transistor) that is connected to a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

Technology is disclosed herein for efficient two-sided GIDL erase of non-volatile memory cells. If there is an asymmetry between the GIDL voltages at the two ends of the NAND string, the two-sided GIDL erase may be negatively impacted. One embodiment equalizes voltages (such as GIDL voltages) at each of the two ends of the NAND string. A voltage pulse, as the term is defined herein, has a first transient period in which the voltage changes (e.g., increases) from an initial voltage to a steady state magnitude, a steady state period during which the voltage (referred to as steady state voltage) stays relatively stable at the steady state magnitude, and a second transient period in which the voltage changes (e.g., decreases) from steady state magnitude to a final voltage. The initial voltage, the steady state voltage, and the final voltage are relatively stable voltages. The final voltage is not required to have the same magnitude as the initial voltage. If the initial voltage is lower than the steady state voltage, the final voltage may be less than or greater than the steady state voltage. If the initial voltage is greater than the steady state voltage, the final voltage could be less than or greater than the steady state voltage. Although the voltage is relatively stable during the steady state period, there may be some small variations in the steady state magnitude during the steady state period due to, for example, noise or other non-ideal factors. Thus, the steady state magnitude of a voltage pulse is defined herein as the average voltage during the steady state period. Techniques are disclosed herein to create erase voltage pulses (e.g., GIDL voltage pulses) at each end of the NAND string that have substantially the same steady state voltage magnitudes. Herein, "two voltage pulses have substantially the same steady state voltage magnitude" if the difference in steady state voltage magnitudes is within 3% of the larger steady state voltage magnitude. In one embodiment, the difference in steady state voltage magnitudes of two substantially symmetric erase voltage pulses is within 2% of the larger steady state voltage magnitude. In one embodiment, the difference in steady state voltage magnitudes of two substantially symmetric erase voltage pulses is within 1% of the larger steady state voltage magnitude. If two voltage pulses do not have substantially the same steady state voltage magnitudes, then their steady state voltage magnitudes are defined as being different.

Techniques are disclosed herein to create voltage pulses at select transistors at each end of the NAND string that are substantially symmetric. These voltage pulses could be GIDL voltage pulses, or other voltage pulses applied to terminals of select transistors during a GIDL erase, as disclosed herein. Herein, "two voltage pulses are substantially symmetric" if they have substantially the same steady state voltage magnitudes and the difference in voltage magnitudes at any given time during the first transient period of either of the two voltages are within 3% of the larger steady state magnitude of the two voltages. The second transient period is not a factor in whether two voltage pulses are substantially symmetric. In one embodiment, the difference in steady state voltage magnitudes of two substantially symmetric voltage pulses is within 2% of the larger steady state magnitude and the difference in voltage magnitudes of two substantially symmetric voltages at any given time during the first transient period of either of the two voltages is within 2% of the larger steady state magnitude. In one embodiment, the difference in steady state voltage magnitudes of two substantially symmetric voltage pulses is within 1% of the larger steady state magnitude and the difference in voltage magnitudes of two substantially symmetric voltages at any given time during the first transient period of either of the two voltages is within 1% of the larger steady state magnitude.

Herein, "two voltage pulses are asymmetric" if they do not have substantially the same steady state voltage magnitudes or if the difference in voltage magnitudes at any given time during the first transient period of either of the two voltages are more than 3% of the larger steady state magnitude of the two voltages.

If there is an asymmetry between the GIDL currents at the two ends of the NAND string, the two-sided GIDL erase may be negatively impacted. In one embodiment, the GIDL currents at the two ends of the NAND string are equalized with each other, which improves erase efficiency. A GIDL current, in one embodiment, comprises a non-linear transient response to a GIDL voltage pulse. The magnitude of the GIDL current does not necessarily closely track the magnitude of the GIDL voltage pulse. A GIDL current may increase rapidly to a peak current and then decrease. The increase in GIDL current occurs while the GIDL voltage is increasing during a first transient period, in one embodiment. It is possible that the GIDL current could increase during the steady state period of the GIDL voltage, but that is not required. The GIDL current might remain at the peak current for a steady state period, but that is not required. The GIDL current may decrease while the GIDL voltage is still increasing (during the first transient period) and/or during the steady state period of the GIDL voltage.

Techniques are disclosed herein to create GIDL currents at each end of the NAND string that have substantially the same current magnitude while GIDL voltage pulses are applied to select transistors at each end of a NAND string. Herein, "two GIDL currents have substantially the same magnitude" if their magnitudes are within 3% of the larger peak magnitude of the two GIDL currents. In one embodiment, the GIDL currents at each end of the NAND string have substantially the same current magnitude at any given time while either GIDL voltage pulse applied to select transistors at opposite ends of a NAND string is in a first transient period (e.g., increasing to a steady state magnitude). In one embodiment, the difference in current of two GIDL currents at each end of a NAND string at any given time during the first transient period of either GIDL voltage is within 2% of the larger peak GIDL current magnitude. In one embodiment, the difference in current of two GIDL currents at each end of a NAND string at any given time during the first transient period of either GIDL voltage is within 1% of the larger peak GIDL current magnitude.

In one embodiment, the GIDL currents at each end of the NAND string have substantially the same current magnitude while either GIDL voltage pulse applied to select transistors at opposite ends of a NAND string is in a steady state period. In one embodiment, the difference in current of two GIDL currents at each end of a NAND string at any given time during the steady state period of either GIDL voltage is within 2% of the larger peak GIDL current magnitude. In one embodiment, the difference in current of two GIDL currents at each end of a NAND string at any given time during the steady state period of either GIDL voltage is within 1% of the larger peak GIDL current magnitude.

Techniques are disclosed herein to create GIDL currents at each end of the NAND string that are substantially symmetric. Herein, "two GIDL currents are substantially symmetric" if the difference in GIDL current magnitudes at any given time during both the first transient period and the steady state period of either of the two GIDL voltages are within 3% of the larger peak magnitude of the two GIDL currents. The second transient period of the GIDL voltages is not a factor in whether two GIDL currents are substantially symmetric. In one embodiment, the difference in current magnitude of two substantially symmetric GIDL currents at any given time during the first transient periods and the steady state periods of either of the two GIDL voltages are within 2% of the larger peak GIDL current magnitude. In one embodiment, the difference in current magnitude of two substantially symmetric GIDL currents at any given time during the first transient periods and the steady state periods of either of the two GIDL voltages are within 1% of the larger peak GIDL current magnitude.

Creating substantially symmetric GIDL voltage pulses and/or substantially symmetric GIDL currents at each end of the NAND string improves two-sided GIDL erase efficiency. Creating GIDL voltage pulses at each end of the NAND string having substantially the same steady state magnitude and/or GIDL currents at each end of the NAND string having substantially the same steady state magnitude improves two-sided GIDL erase efficiency. Erase speed is improved when performing embodiments of two-sided GIDL erase. Current consumption may be reduced when performing embodiments of two-sided GIDL erase. Power consumption may be reduced when performing embodiments of two-sided GIDL erase.

One reason an asymmetry in GIDL voltage pulses at each end of the NAND string could possibly occur is due to differences in impedances on pathways that deliver voltages to the select transistors at each end of the NAND string. In one embodiment, a first pathway that includes a bit line delivers a voltage to a first select transistor at one end of the NAND string, and a second pathway that includes a source line delivers a voltage to a second select transistor at the other end of the NAND string. The first and second pathways may have different impedances. The different impedances may be due, at least in part, to different bit line and source line impedances. For example, the first and second pathways may have different resistances and/or the capacitances. Therefore, the first and second pathways may have different RC delays. The first and second pathways may have different voltage drops along the respective first and second pathways. In one embodiment, the different impedances are compensated for when creating GIDL voltage pulses at terminals of the select transistors.

One reason that an asymmetry in GIDL pulse could occur at each end of the NAND string is due to structural differences at each end of the NAND string. For some NAND strings, there may be an asymmetry between the two ends such that even if the drain-to-gate voltages of select transistors at each end of the NAND string have the same magnitude, the GIDL currents may have different magnitudes. A possible reason for this asymmetry in GIDL currents is due to different doping at each end of the NAND string. Techniques are disclosed herein to generate GIDL currents at each end of the NAND string that have substantially the same magnitude. In one embodiment, the GIDL voltages that are created at the select transistors at each end of the NAND string have different magnitudes in order to generate GIDL currents that have substantially the same magnitude.

FIG. 1-FIG. 6B describe one example of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write/erase circuits 128. Memory structure 126 is addressable by word lines via a row decoder 124 and by bit lines via a column decoder 132. The read/write/erase circuits 128 include multiple sense blocks 150 including SB1, SB2, . . . , SBp (sensing circuitry) and allow a page of memory cells to be read or programmed in parallel. Also, many strings of memory cells can be erased in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write/erase circuits 128 to perform memory operations (e.g., write, read, erase and others) on memory structure 126, and includes state machine 112, an on-chip address decoder 114, and a power control circuit 116. In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines, bit lines, and select lines during memory operations. The power control circuit 116 includes voltage circuitry, in one embodiment. Power control circuit 116 may include charge pumps for creating voltages. The sense blocks include bit line drivers. The power control circuit 116 executes under control of the state machine 112, in one embodiment. In one embodiment, power control circuit 116 includes P1 circuitry 922, P2 circuitry 924, P3 circuitry 926, and P4 circuitry 928 (see FIGS. 9A, 9B. 13A, 13B). In one embodiment, power control circuit 116 includes P5 circuitry 1922, P6 circuitry 1924, P7 circuitry 1926, and P8 circuitry 1928 (see FIG. 19).

State machine 112 and/or controller 122 (or equivalently functioned circuits), in combination with all or a subset of the other circuits depicted in FIG. 1, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material.

In another embodiment, memory structure 126 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two-dimensional arrays, three-dimensional arrays, cross-point arrays, stacked two-dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 2:
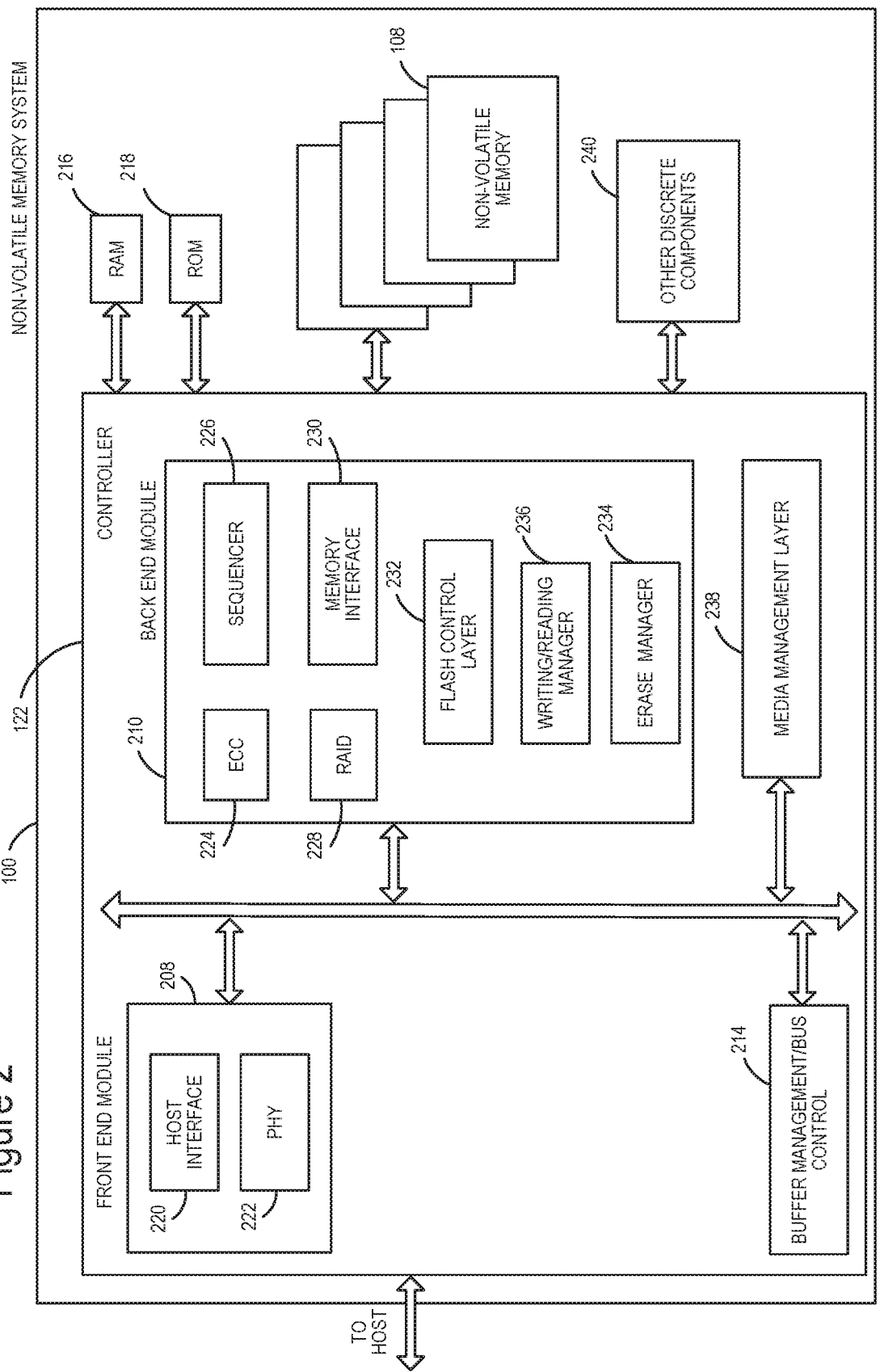
FIG. 2 is a block diagram depicting one embodiment of a memory system.

FIG. 2 is a block diagram of example memory system 100, depicting more details of one embodiment of controller 122. The controller in FIG. 2 is a flash memory controller, but note that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card-based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. One embodiment includes an erase manager 234, which can be used to manage (in conjunction with the circuits on the memory die) the erase of memory cells. The erase manager 234, in combination with all or a subset of the circuits depicted in FIG. 1, can be considered an erase controller.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

Figure 3:
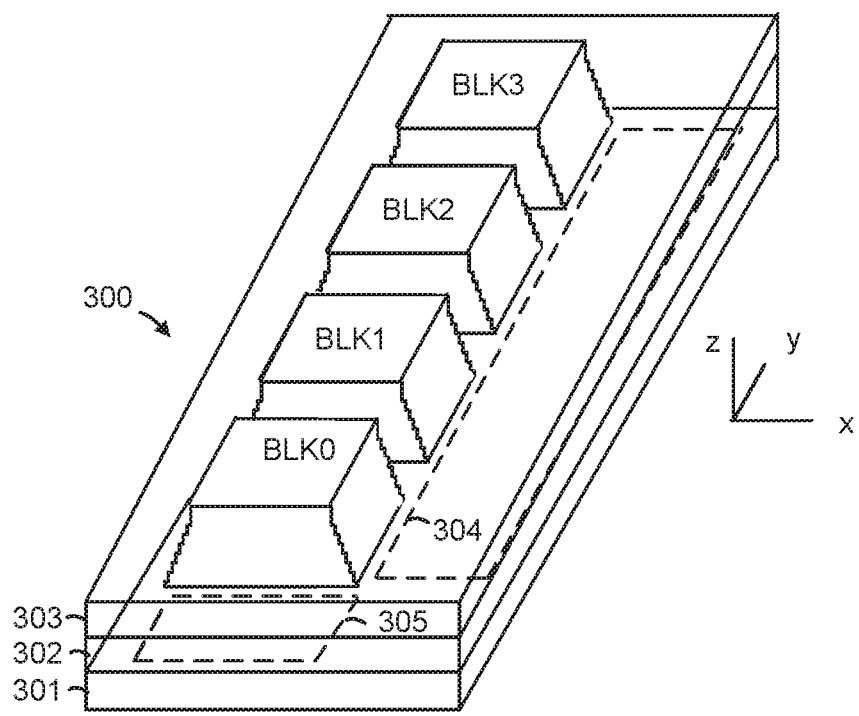
FIG. 3 is a perspective view of a memory device.

FIG. 3 is a perspective view of a memory device 300 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The substrate has a major surface that extends in the x-y plane. The blocks may be formed over the major surface. The peripheral area 304 runs along an edge of each block while the peripheral area 305 is at an end of the set of blocks. Each peripheral area can include circuitry, including but not limited to voltage drivers which can be connected to control gate layers, bit lines and source lines of the blocks.

The substrate 301 can also carry circuitry under the blocks, along with one or more lower metal layers which are patterned in conductive paths to carry signals of the circuitry. The blocks are formed in an intermediate region 302 of the memory device. In an upper region 303 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

FIG. 4 depicts an example cross-sectional view of a portion of one of the blocks of FIG. 3. The block comprises a stack 410 of alternating conductive and dielectric layers. In this example, the conductive layers comprise SGD layer, SGS layers, dummy word line layers (or word lines) DWLd, DWLs, in addition to data word line layers (or word lines) WLL0-WLL14. The dielectric layers are labelled as DL0-DL19. Further, regions of the stack which comprise NAND strings NS1 and NS2 are depicted. Each NAND string encompasses a memory hole 418 or 419 which is filled with materials which form memory cells adjacent to the word lines. A region 422 of the stack is shown in greater detail in FIG. 6A. A region 423 of the stack is shown in greater detail in FIG. 6B. Note that there may be more or fewer SGD layers, SGS layers, dummy word line layers, and data word line layers.

Underneath the stack is a source line (SL) 411. In one approach, a portion of the source line SL comprises a polysilicon layer 411a which is in contact with a source end of each string of memory cells in a block. The polysilicon layer 411a is in electrical contact with the NAND string channel (not shown in FIG. 4). The polysilicon layer 411a is in contact with a metal 411b (e.g., tungsten) layer. The source line 411 may be shared by all of the blocks in a plane, in one approach.

NS1 has a source-end 413 at a bottom 416b of the stack 416 and a drain-end 415 at a top 416a of the stack. Metal-filled slits 417 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 421 connects the drain-end 415 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage sources.

FIG. 5 depicts an example transistor 590. The transistor comprises a control gate CG, a drain D, a source S and a channel CH. The control gate may also be referred to as a control terminal or as a gate terminal. The control gate is formed by a portion of one of the conductive layers (e.g., SGD, DWL, WLL, SGS), in one embodiment. The drain and source may also be referred to as terminals of the transistor. Note that which physical terminals of the transistor functions as the source and drain may depend on the voltages that are applied to the transistor. The transistor may be part of a select gate or a memory cell. In the case that the transistor is part of a select gate, the drain may be biased to a significantly higher voltage than the control gate during a portion of an erase procedure, which may result in a GIDL current. For example, the drain may be biased to a first voltage, while the control gate is biased to a second voltage. The GIDL current may help to pass the drain voltage to the channel of the NAND string, such that the channel of the memory cells may be at a voltage that is high enough to erase the memory cells.

In the case of a memory cell transistor, the control gate voltage can be set to a low value during erase such as 0 V so that the channel-to-control gate voltage results in a significant electrical field. In one embodiment, carrier recombination of holes from the channel with electrons in the charge trapping region of memory cells results in a lowering of the Vth of the memory cell. In the case of a select gate transistor, the control gate voltage can be set to a higher value such as 10 V so that the channel-to-control gate voltage is not high enough to lower the Vth of the transistor.

In one embodiment, a select gate transistor has a region having the same material as the memory film of a memory cell. This material serves as a gate dielectric in the select gate transistor. In this case, the threshold voltage of the select gate transistor can be altered similar to how a memory cell transistor's threshold voltage can be altered. In one embodiment a select gate transistor does not have the memory film material, but has a single dielectric (e.g., silicon dioxide) as a gate dielectric. In such as case, the select gate transistor's threshold voltage cannot be altered, in a significant way, by a voltage applied to the gate.

FIG. 6A depicts a close-up view of the region 422 of the stack of FIG. 4. Memory cells are formed at the different levels of the stack at the intersection of a word line layer and a memory hole. In this example, SGS transistor 670 is provided below dummy memory cell 671. The SGS transistor 670 may comprise one or more gate layers, in one embodiment. The SGS transistor gate layers may be electrically connected to the same voltage source, in one embodiment. Data memory cells 672, 673 are above the dummy memory cell 671. A number of layers can be deposited along the sidewall (SW) of the memory hole 630 and/or within each word line layer, e.g., using atomic layer deposition. For example, each pillar 699 or column which is formed by the materials within a memory hole can include a blocking oxide/block high-k material 660, charge-trapping layer 663 or film such as silicon nitride ($Si_3N_4$) or other nitride, a tunneling layer 664, a channel 665, and a dielectric core 666. The channel 665 is formed from a semiconductor, such as, silicon, silicon germanium, etc. In one embodiment, the channel 665 is formed from a polycrystalline semiconductor. In one embodiment, the channel 665 is formed from a crystalline semiconductor. A word line layer can include a conductive metal 662 such as Tungsten. A portion a word line layer that is adjacent to layer 660 is referred to as a control gate. For example, control gates 651, 652, 653 and 654 are provided. In this example, all of the layers except the metal are provided in the memory hole. In other approaches, some of the layers can be in the control gate layer. Additional pillars are similarly formed in the different memory holes. A pillar can form a columnar active area of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. In one embodiment, during erase, holes tunnel from the channel to the charge trapping layer to recombine with electrons thereby decreasing the Vth of memory cells.

Each of the memory holes can be filled with a plurality of annular layers comprising a blocking oxide layer, a charge trapping layer, a tunneling layer and a channel layer. A core region of each of the memory holes is filled with a dielectric material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

The source line 411 includes a polysilicon layer 411a and a metal layer 411b. The polysilicon layer 411a is in direct contact with the channel 665. Thus, the channel 665 is in electrical contact with the polysilicon layer 411a. The channel 665 is not in direct electrical contact with a p-well, in this example. Thus, the configuration in FIG. 6A does not allow the memory cells to be erased by raising a p-well voltage to a voltage to charge up the channel 665. However, note that even if the channel 665 is in direct electrical contact with a p-well, a two-sided GIDL erase may still be performed. Thus, embodiments of two-sided GIDL erase disclosed herein are not limited to the configuration of FIG. 6A.

A portion of the channel 665 that is indicated by region 635 is doped with an n-type donor, in one embodiment. For example, the portion of the channel 665 that is indicated by region 635 may be doped with phosphorus or arsenic. The doping is N+, in one embodiment. The rest of the channel 665 is not intentionally doped, in one embodiment. However, the undoped portion of the channel 665 may behave as p−. Thus, there is an N+/p− junction in the channel 665 at the interface between region 635 and the undoped portion of the channel 665, in one embodiment.

Figure 6B:
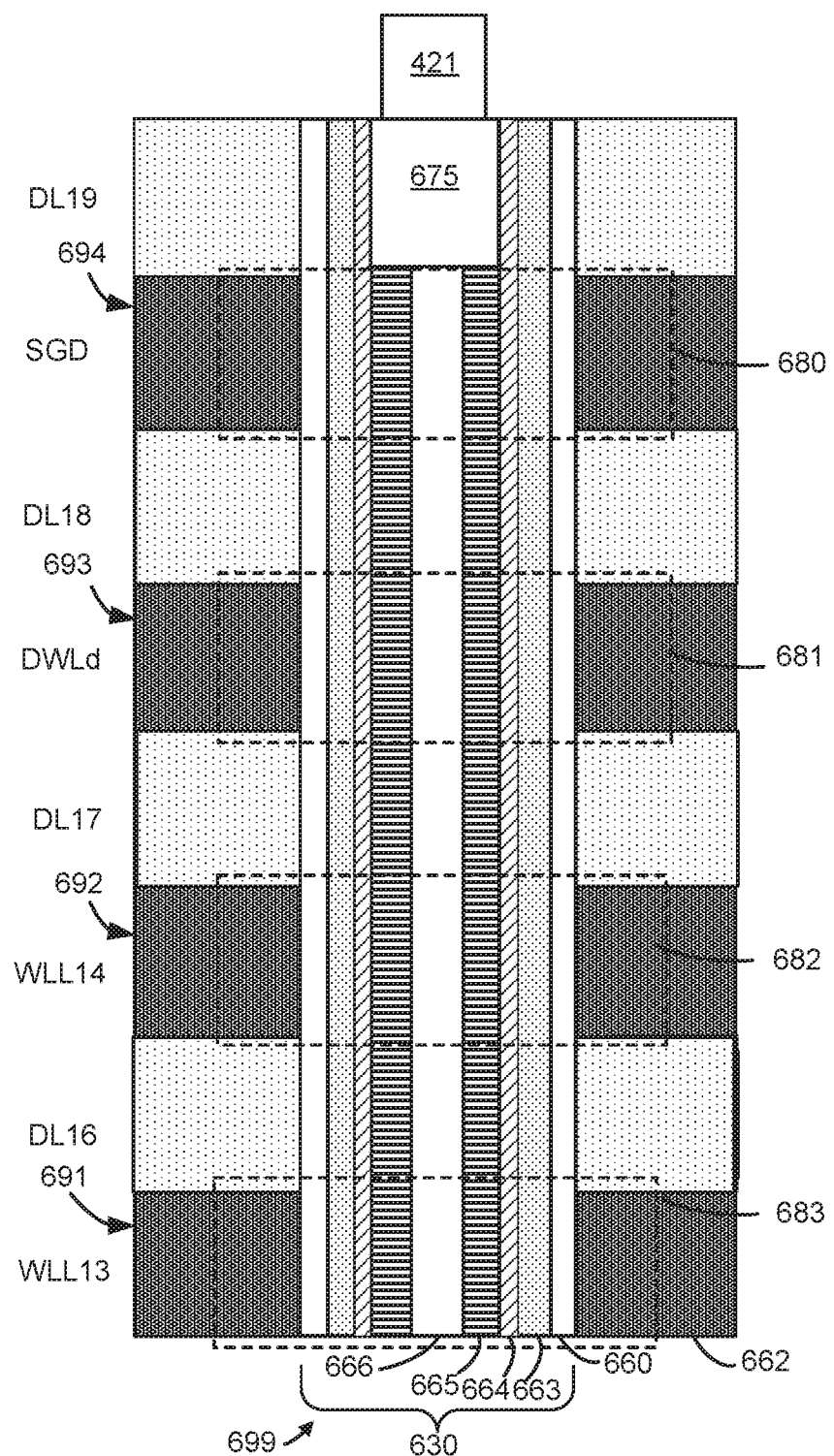
FIG. 6B depicts a close-up view of the region 423 of the stack of FIG. 4.

FIG. 6B depicts a close-up view of the region 423 of the stack of FIG. 4. Memory cells are formed at the different levels of the stack at the intersection of a word line layer and a memory hole. In this example, SGD transistor 680 is provided above dummy memory cell 681 and data memory cells 682 and 683. The SGD transistor 680 may comprise one or more gate layers, in one embodiment. The SGD transistor gate layers may be electrically connected to the same voltage source, in one embodiment. Pillar 699 or column which is formed by the materials within a memory hole can include a blocking oxide/block high-k material 660, charge-trapping layer 663 or film such as silicon nitride ($Si_3N_4$) or other nitride, a tunneling layer 664, a channel 665, and a dielectric core 666. Control gates 691, 692, 693 and 694 are provided. In this example, all of the layers except the control gates are provided in the memory hole. In other approaches, some of the layers can be in the control gate layer. Additional pillars are similarly formed in the different memory holes.

A polysilicon plug 675 forms an electrical contact between channel 665 and conductive via 421. The polysilicon plug 675 is doped with an n-type donor, in one embodiment. For example, the polysilicon plug 675 may be doped with phosphorus and/or arsenic. The doping is N+, in one embodiment. The channel 665 is not intentionally doped, in one embodiment. However, the channel 665 may behave as p−. Thus, there is an N+/p− junction at the interface between the polysilicon plug 675 and the channel 665, in one embodiment.

As discussed above, there may also be an N+/p− junction near the transistor 670. These two N+/p− junctions may have different doping concentrations. For example, the N+ concentration in region 635 may be different than the N+ concentration in the polysilicon plug 675. This may result in a different magnitude of GIDL current at transistors 670 and 680 even if those transistors have the same drain-to-gate voltages (or GIDL voltages). In one embodiment, different magnitude drain-to-gate voltages (or GIDL voltages) are deliberately created at terminals of transistors 670 and 680 in order to compensate for physical differences (such as doping concentrations) at each end of the NAND string in order to achieve substantially the same magnitude GIDL current at each end of the NAND string (e.g., at transistors 670 and 680). This may improve erase speed, reduce current consumption, and/or reduce power consumption.

Figure 7:
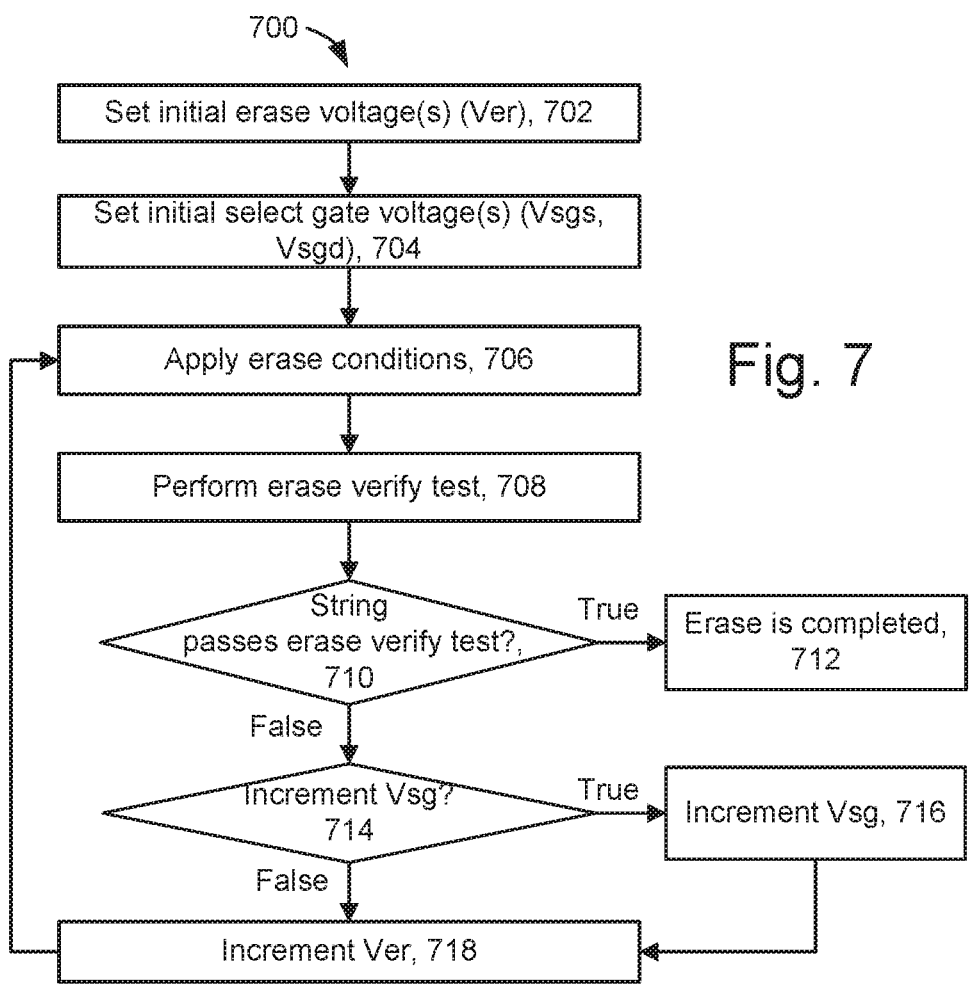
FIG. 7 depicts one embodiment of a process for performing an erase operation.

FIG. 7 depicts one embodiment of a process 700 for performing an erase operation. Process 700 is described with respect to a string of memory cells. The string includes a select transistor on each end of the string. For example, a first select transistor may be a drain side select transistor, which has one of its terminals (e.g., drain) coupled to a bit line. A second select transistor may be a source side select transistor, which has one of its terminals coupled to a source line. In one embodiment, this is a NAND string of memory cells. The process 700 may be performed in parallel on many strings. The process 700 may be used to erase a NAND string such as depicted in FIGS. 4, 6A and 6B.

Step 702 sets a magnitude of an initial steady state erase voltage (Ver). In one embodiment, process 700 performs a two-sided GIDL erase. The erase voltage pulse is to be applied to the bit line and to the source line. In one embodiment, the steady state magnitude of the erase voltage pulse is different for the bit line and the source line. In one embodiment, the magnitude of the steady state erase voltage is the same for the bit line and the source line. Step 702 refers to the voltage that is applied to the end of the bit line and the source line that is not adjacent to the select transistors.

Due to factors such as voltage drop due to the resistances of the bit line and source line, the steady state erase voltage may have a smaller magnitude when it reaches a select transistor. In one embodiment, the magnitude of the steady state erase voltages that are applied to the bit line and source line are different, such that the magnitudes will be substantially the same at the select transistors.

Due to factors such as a different RC delay along the bit line and source line, the erase voltage pulses may experience different delays in getting to the select transistors. In one embodiment, the timing of starting the erase voltage pulses applied to the bit line and source line are different, such that the erase voltage pulses will arrive at the select transistors at the substantially same time.

Step 704 sets a magnitude of an initial steady state select gate voltage (Vsg). Herein, Vsg may be referred to as an erase voltage, as it helps to establish a GIDL voltage between two terminals of a select transistor. A select gate voltage (Vsgd) pulse is provided to the drain side select line that is connected to a control gate of a drain side select transistor. A select gate voltage (Vsgs) pulse is provided to the source side select line that is connected to a control gate of a source side select transistor. The steady state magnitudes of Vsgd and Vsgs may be the same as each other or different from each other.

Due to factors such as voltage drop due to the resistances along the drain side select line and source side select line, the select gate voltage may have a smaller magnitude when it reaches the select transistor. In one embodiment, the magnitude of the select gate voltages that are applied to the drain side select line and drain side select line are different, such that the magnitudes will be substantially the same at the select transistors.

Due to factors such as a different RC delay along the drain side select line and source side select line, the select gate voltage pulses may experience different delays in getting to the select transistors. In one embodiment, the timing of starting the select gate voltage pulses applied to the drain side select line and source side select line are different, such that the select gate voltage pulses will arrive at the select transistors at substantially the same time.

Step 706 includes applying erase conditions. Step 706 may include applying voltage pulses to a bit line, a source line, a select line connected to a drain side select transistor, a select line connected to a source side select transistor, and word lines connected to control gates of memory cells. The same magnitude or different magnitude erase voltages may be applied to the bit line and the source line. The erase voltage pulses applied to the bit line and the source line may start at the same time or different times. The same magnitude or different magnitude gate voltages may be applied to the drain select line and the source select line, and may start at the same time or a different time. In one embodiment, the drain select line and the source select line are left floating. Erase enable voltages may be applied to the word lines. Step 706 may include controlling the timing of the various signals. Techniques are discussed below for configuring various attributes of the voltage pulses in step 706 in order to improve erase performance.

Step 706 may include charging up (e.g., increasing the voltage of) a channel of the memory string from both the source and the drain end, and setting a low voltage such as 0 V on the word lines connected to the control gates of the memory cells. In one embodiment, charging up the channels includes applying a suitable voltage to the drain side and/or the source side select gates to generate GIDL current.

Step 708 includes performing an erase verify test for a string. Typically, this involves setting an erase verify voltage VvEr to the word lines that are connected to control gates of memory cells on the string while sensing a current in the memory string. If the current is sufficiently high, the string is considered to pass the verify test. If the string passes the erase verify test at decision step 710, the erase operation is completed, at step 712. If the string does not pass the erase verify test at decision step 710, the process 700 continues at step 714.

Step 714 includes a determination of whether the select gate voltage is to be incremented. If so, then the select gate voltage is incremented in step 716. Whether or not the select gate voltage is incremented, the erase voltage is incremented in step 718. Then, the next iteration of the erase procedure is performed by returning to step 706. An erase iteration (or loop) typically involves applying erase conditions followed by performing a verify test, although in some cases the verify test is omitted.

Figure 8:
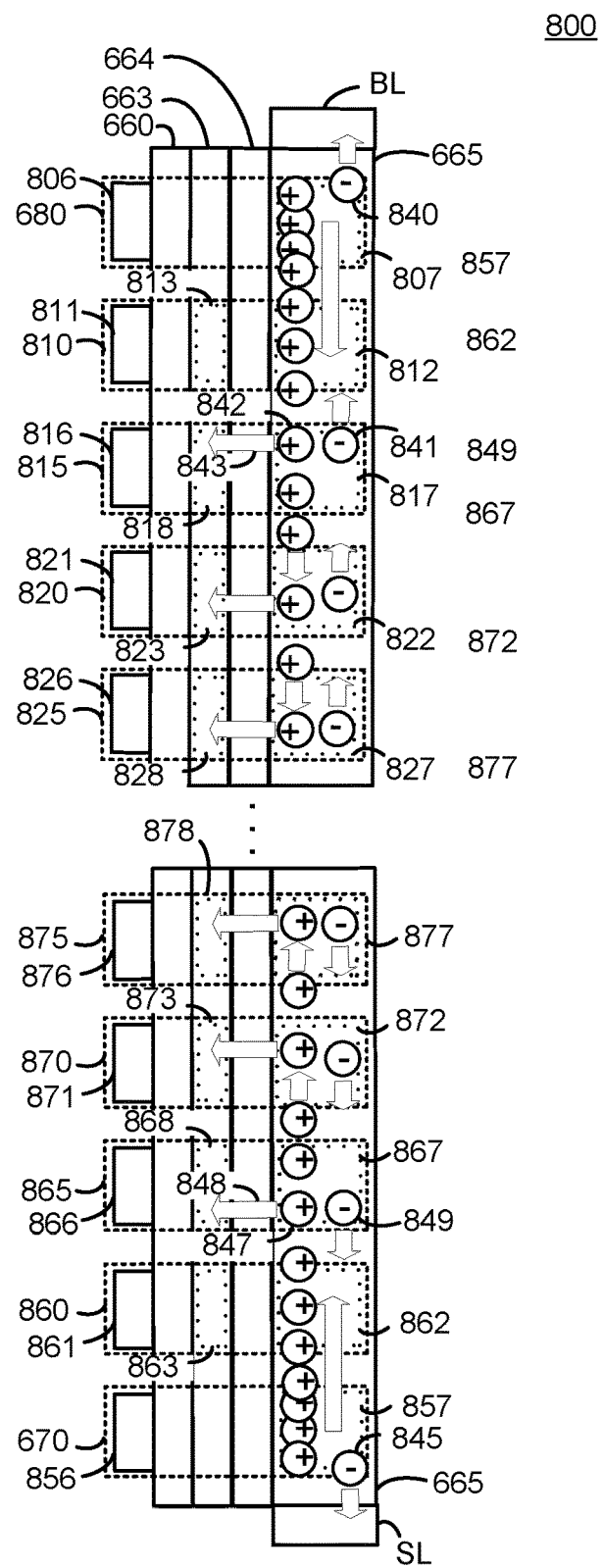
FIG. 8 depicts the movement of holes and electrons in a NAND string during a two-sided erase.

FIG. 8 depicts the movement of holes and electrons in a NAND string during a two-sided GIDL erase. An example NAND string 800 that includes a channel layer 665 connected to a bit line (BL) and to a source line (SL). A tunnel layer (TNL) 664, charge trapping layer (CTL) 663, and a block oxide (BOX) 660 are layers which extend around the memory hole of the string. Different regions of the channel layers represent channel regions which are associated with respective storage elements or select gate transistors. These channel regions are at a same height and stack level in the stacked memory device as the control gates of the storage elements or select gate transistors.

The NAND string 800 includes an SGD transistor 680 with a control gate 806 and a channel region 807. The NAND string 800 also includes storage elements 810, 815, 820, and 825, control gates 811, 816, 821, and 826, CTL regions 813, 818, 823, and 828, and channel regions 812, 817, 822, and 827, respectively.

The NAND string 800 includes an SGS transistor 670 with a control gate 856 and a channel region 857. The NAND string 800 also includes storage elements 860, 865, 870, and 875, control gates 861, 866, 871, and 876, CTL regions 863, 868, 873, and 878, and channel regions 862, 867, 872, and 877, respectively.

Representative holes are depicted in the channel layers as circles with a "+" sign and representative electrons are depicted in the channel layers as circles with a "−" sign. Electron-hole pairs are generated by a GIDL process. Initially, during an erase operation, the electron-hole pairs are generated at the SGD and SGS transistors. The holes move away from the driven ends into the channel, thereby charging the channel to a positive potential. The electrons generated at the SGD transistor 680 move toward the bit line (BL) due to the positive potential there. The electrons generated at the SGS transistor 670 move toward the source line (SL) due to the positive potential there. Subsequently, during the erase period of each storage element, additional holes are generated by GIDL at virtual junctions which are formed in the channel at the edges of the control gate of the storage element. However, some holes are also removed from the channel as they tunnel to the CTL regions.

Electrons are also generated by the GIDL process. Initially, during the erase operation, the electrons are generated at the SGD and SGS transistors and move toward the driven ends. Subsequently, during the erase period of each storage element, additional electrons are generated by GIDL at virtual junctions, which are formed in the channel at the edges of the control gate of the storage element.

At one end (e.g., drain side) of the NAND string, example electrons 840 and 841 move toward the bit line. Electron 840 is generated at the SGD transistor and electron 841 is generated at a junction of the storage element 815 in the channel region 817. Also, in the drain side, example holes including a hole 842 move away from the bit line as indicated by arrows. The hole 842 is generated at a junction of the storage element 815 in the channel region 817 and can tunnel into the CTL region 818 as indicated by arrow 843.

At the other end (e.g., source side) of the NAND string, example electrons 845 and 849 move toward the source line. Electron 845 is generated at the SGS transistor and electron 849 is generated at a junction of the storage element 865 in the channel region 867. Also, in the source side, example holes including a hole 847 move away from the source line as indicated by the arrow. The hole 847 is generated at a junction of the storage element 865 in the channel region 867 and can tunnel into the CTL region 868 as indicated by arrow 848.

Figure 9A:
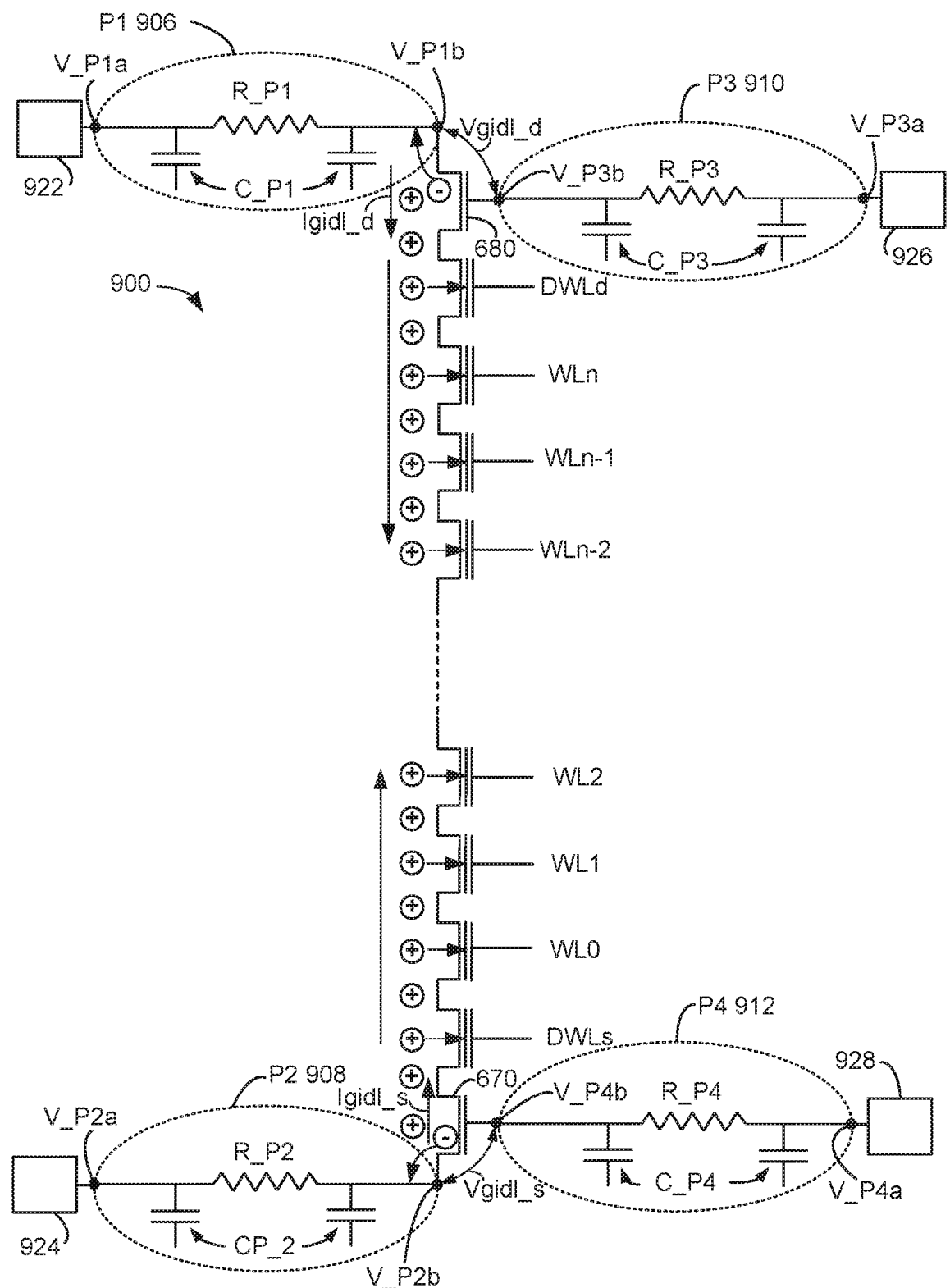
FIGS. 9A and 9B are diagram of embodiments of a NAND string and pathways that may provide voltages to select transistors of the NAND string.

FIG. 9A is a diagram of NAND string 900 and pathways that may provide voltages to select transistors of the NAND string. The NAND string 900 has a first select transistor 680 at one end of the NAND string, and a second select transistor 670 at the other end of the NAND string. The first select transistor 680 may be referred to as a drain side select transistor. The second select transistor 670 may be referred to as a source side select transistor. There are a number of memory cells connected between the two select transistors. The control gates of data memory cells are connected to various data word lines (e.g., WL0-WLn). The control gates of dummy memory cells are connected to various dummy word lines (e.g., DWLs, DWLd). The NAND string 900 in FIG. 9A is implemented with the NAND string depicted in FIGS. 4, 6A, and 6B, in one embodiment. However, the NAND string in FIG. 9A is not limited to the NAND string depicted in FIGS. 4, 6A, and 6B.

FIG. 9A depicts a number of pathways 906, 908, 910, and 912. Herein, a "pathway" is any tangible medium capable of transmitting an electrical signal (e.g., a voltage pulse or a current pulse) along the pathway. A pathway may include an electrically conductive path. In embodiments, a pathway may include, but is not limited to, one or more of a wire, trace, transmission line, track, pad, layer, lead, metal, portion of a printed circuit board or assembly, conducting material and other material that may transfer or carry an electrical signal. A pathway may include an electrical component such as a transistor. The transistor may act as a switch that is closed to allow the electrical signal to propagate along the pathway, and opened to prevent the electrical signal from propagating along the pathway. In embodiments, a pathway may form one or more geometric shapes, such as a line or multiple connected lines. In embodiments, a pathway may be unidirectional or bidirectional in transferring electrical signals between circuits and within circuits.

Pathway P1 906 is connected to one terminal (e.g., drain terminal) of the first select transistor 680. Pathway P1 906 includes a bit line, in one embodiment. Pathway P1 906 may include other elements such as switches (e.g., transistors). Pathway P1 906 may also be referred to as an electrically conductive pathway. Pathway P1 906 has an impedance, which is represented by resistance (R_P1) and a capacitance (C_P1). Resistance (R_P1) and capacitance (C_P1) include a bit line resistance and a bit line capacitance, in one embodiment. Resistance (R_P1) and a capacitance (C_P1)

may include resistances and/or capacitances of other components along the pathway P1.

P1 circuitry 922 is configured to apply a voltage pulse V_P1a to one end of pathway P1 906. P1 circuitry 922 may comprise any electrical components that are capable of providing a voltage. The voltage is relative to some common point, such as ground. P1 circuitry 922 includes one or more charge pumps, in one embodiment. Due to the impedance of pathway P1 906, there may be an RC delay along the pathway P1 906. Due to the impedance of pathway P1 906, there may be a voltage drop along the pathway P1 906. The voltage pulse is referred to as V_P1b at the other end of the pathway P1 906 to indicate the possible delay and/or change in magnitude.

Pathway P2 908 is connected to one terminal (e.g., drain terminal) of the second select transistor 670. Pathway P2 908 includes a source line, in one embodiment. Pathway P2 908 may include other elements such as switches (e.g., transistors). Pathway P2 908 may also be referred to as an electrically conductive pathway. Pathway P2 908 has an impedance, which is represented by resistance (R_P2) and a capacitance (C_P2). Resistance (R_P2) and capacitance (C_P2) include a source line resistance and a source line capacitance, in one embodiment. Resistance (R_P2) and a capacitance (C_P2) may include resistances and/or capacitances of other components along the pathway P2.

P2 circuitry 924 is configured to apply a voltage pulse V_P2a to pathway P2 908. P2 circuitry 924 may comprise any electrical components that are capable of providing a voltage. The voltage is relative to some common point, such as ground. P2 circuitry 924 includes one or more charge pumps, in one embodiment. Due to the impedance of pathway P2 908, there may be an RC delay along the pathway P2 908. Due to the impedance of pathway P2 908, there may be a voltage drop along the pathway P2 908. The voltage pulse is referred to as V_P2b at the other end of the pathway P2 908 to indicate the possible delay and/or change in magnitude.

Pathway P3 910 is connected to one terminal (e.g., gate terminal) of the first select transistor 680. Pathway P3 910 includes a select line, in one embodiment. The select line is referred to as a drain side select line, in one embodiment. Pathway P3 910 may include other elements such as switches (e.g., transistors). Pathway P3 910 may also be referred to as an electrically conductive pathway. Pathway P3 910 has an impedance, which is represented by resistance (R_P3) and a capacitance (C_P3). Resistance (R_P3) and capacitance (C_P3) include a select line resistance and a select line capacitance, in one embodiment. Resistance (R_P3) and a capacitance (C_P3) may include resistances and/or capacitances of other components along the pathway P3 910.

P3 circuitry 926 is configured to apply a voltage pulse V_P3a to pathway P3 910. P3 circuitry 926 may comprise any electrical components that are capable of providing a voltage. The voltage is relative to some common point, such as ground. P3 circuitry 926 includes one or more charge pumps, in one embodiment. Due to the impedance of pathway P3 910, there may be an RC delay along the pathway P3 910. Due to the impedance of pathway P3 910, there may be a voltage drop along the pathway P3 910. The voltage pulse is referred to as V_P3b at the other end of the pathway P3 910 to indicate the possible delay and/or change in magnitude. In one embodiment, P3 circuitry 926 leaves pathway P3 910 floating, such that the voltage of the gate terminal of transistor 680 floats during a two-sided GIDL erase.

Pathway P4 912 is connected to one terminal (e.g., gate terminal) of the second select transistor 670. Pathway P4 912 includes a select line, in one embodiment. The select line is referred to as a source side select line, in one embodiment. Pathway P4 912 may include other elements such as switches (e.g., transistors). Pathway P4 912 may also be referred to as an electrically conductive pathway. Pathway P4 912 has an impedance, which is represented by resistance (R_P4) and a capacitance (C_P4). Resistance (R_P4) and capacitance (C_P4) include a select line resistance and a select line capacitance, in one embodiment. Resistance (R_P4) and a capacitance (C_P4) may include resistances and/or capacitances of other components along the pathway P4 912.

P4 circuitry 928 is configured to apply a voltage pulse V_P4a to pathway P4 912. P4 circuitry 928 may comprise any electrical components that are capable of providing a voltage. The voltage is relative to some common point, such as ground. P4 circuitry 928 includes one or more charge pumps, in one embodiment. Due to the impedance of pathway P4 912, there may be an RC delay along the pathway P4 912. Due to the impedance of pathway P4 912, there may be a voltage drop along the pathway P4 912. The voltage pulse is referred to as V_P4b at the other end of the pathway P4 912 to indicate the possible delay and/or change in magnitude. In one embodiment, P4 circuitry 928 leaves pathway P4 912 floating, such that the voltage of the gate terminal of transistor 670 floats during a two-sided GIDL erase.

Therefore, voltage V_P1b is applied to one terminal (e.g., drain) of transistor 680, with voltage V_P3b is applied to another terminal (e.g., gate) of transistor 680, in one embodiment. In one embodiment, V_P1b-V_P3b causes a GIDL current (I_gidl_s) at transistor 680 during a two-sided GIDL erase. Therefore, V_P1b-V_P3b may be referred to as a GIDL voltage (Vgidl_d). The magnitude of V_P1b-V_P3b is not necessarily the same as the magnitude of V_P1a-V_P3a.

In another embodiment, voltage V_P1b is applied to one terminal (e.g., drain) of transistor 680, while the voltage on pathway 910 is floating. However, the gate terminal of select transistor 680 may rise due to capacitive coupling. Hence, there will be a GIDL voltage Vdigl_a across two terminals of select transistor 680.

Therefore, voltage V_P2b is applied to one terminal (e.g., drain) of transistor 670, with voltage V_P4b is applied to another terminal (e.g., gate) of transistor 670, in one embodiment. In one embodiment, V_P2b-V_P4b causes a GIDL current (I_gidl_s) at transistor 670 during a two-sided GIDL erase. Therefore, V_P2b-V_P4b may be referred to as a GIDL voltage (Vgidl_s). The magnitude of V_P2b-V_P4b is not necessarily the same as the magnitude of V_P2a-V_P4a.

In another embodiment, voltage V_P2b is applied to one terminal (e.g., drain) of transistor 670, while the voltage on pathway 912 is floating. However, the gate terminal of select transistor 670 may rise due to capacitive coupling. Hence, there will be a GIDL voltage Vdigl_a across two terminals of select transistor 670.

Herein any of the voltages (e.g., V_P1b, V_P2b, V_P3b, V_P4b) that are applied to a terminal of a select transistor during a two-sided GIDL erase may be referred to as an erase voltage. Also, the voltage (e.g., Vgidl_d, Vgidl_s) that appears between the drain and gate terminals of a select transistor during a two-sided GIDL erase may be referred to as an erase voltage.

In one embodiment, voltage pulses that are applied to pathways at each end of the NAND string are configured to compensate for different impedances of the pathways at each end of the NAND string. For example, the voltage pulses applied to pathway P1 906 and pathway P2 908 may be configured to compensate for different impedances of the pathway P1 906 and pathway P2 908. As another example, the voltage pulses applied to pathway P3 910 and pathway P4 912 may be configured to compensate for different impedances of the pathway P3 910 and pathway P4 912. In one embodiment, the voltage pulses applied to pathway P3 910 and pathway P4 912 are configured to compensate for different impedances of the pathway P1 906 and pathway P2 908.

In one embodiment, one or more attributes of voltage pulses that are applied to pathways at each end of the NAND string is configured such that a first erase voltage at the first select transistor 680 is substantially symmetric with a second erase voltage at the second select transistor 670. For example, V_P1$b$ may be substantially symmetric with V_P2$b$; V_P3$b$ may be substantially symmetric with V_P4$b$; and/or Vgidl_d may be substantially symmetric with Vgidl_s. Achieving substantially symmetric erase voltages may include setting one or more attributes of the voltage pulses to compensate for different impedances of pathways at each end of the NAND string.

In one embodiment, one or more attributes of voltage pulses that are applied to pathways at each end of the NAND string are configured such that Igidl_d and Igidl_s have substantially the same steady state magnitudes. Achieving substantially the same magnitudes in Igidl_d and Igidl_s may include setting attributes of the voltage pulses to compensate for different impedances of pathways at each end of the NAND string.

FIG. 9A also shows some details of the GIDL currents generated at each end of the NAND string during a two-sided GIDL erase. Representative holes are depicted as circles with a "+" sign and representative electrons are depicted as circles with a "−" sign. Electron-hole pairs are generated at the first and second select transistors 680, 670. GIDL current Igidl_d is generated at first select transistor 680. The electrons move to the first pathway P1 906, and holes move to the NAND channel. GIDL current Igidl_s is generated at second select transistor 680. The electrons move to the second pathway P2 908, and holes move to the NAND channel. The memory cells have an erase enable voltage (not depicted in FIG. 9A) applied to their control gates. The erase enable voltage is significantly lower than the voltage in the NAND channel. Therefore, some of the holes are removed from the NAND channel as they tunnel to the charge trap regions of the memory cells.

Figure 9B:
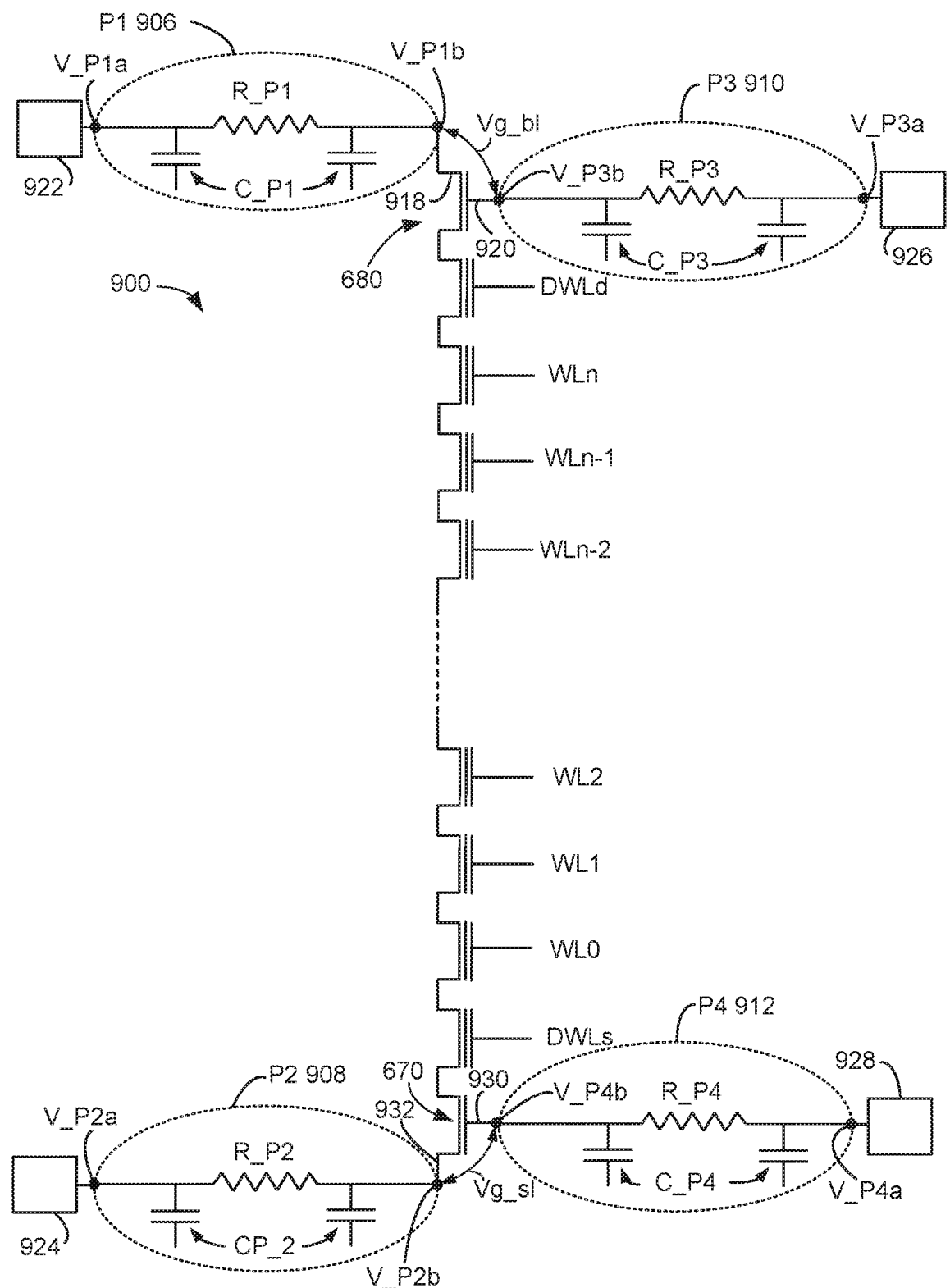

Note that although the example in FIG. 9A is with respect to applying GIDL voltages at the select transistors 680, 670, the voltages that are applied at the select transistors 680, 670 are not required to be GIDL voltages. FIG. 9B is a schematic diagram of one embodiment of a NAND string and pathways connected to select transistors. The NAND string 900 is similar to the string of FIG. 9A. However, a GIDL voltage is not applied and a GIDL current is not generated at the select transistors 680, 670, in this embodiment. Instead, the voltage between the gate terminal 920 to bit line terminal 918 for select transistor 680 is labeled as Vg_bl. The voltage between the gate terminal 930 to bit line terminal 932 for select transistor 670 is labeled as Vg_sl. The gate terminal 920 to bit line terminal 918 for select transistor 680 has substantially the same steady state magnitude as the gate terminal 930 to bit line terminal 932 voltage for select transistor 670, in one embodiment. The gate terminal 920 to bit line terminal 918 voltage for select transistor 680 is a first voltage pulse, and the gate terminal 930 to bit line terminal 932 voltage for select transistor 670 is a second voltage pulse, in one embodiment. The first voltage pulse and the second voltage pulse are substantially symmetric voltage pulses, in one embodiment.

Figure 10:
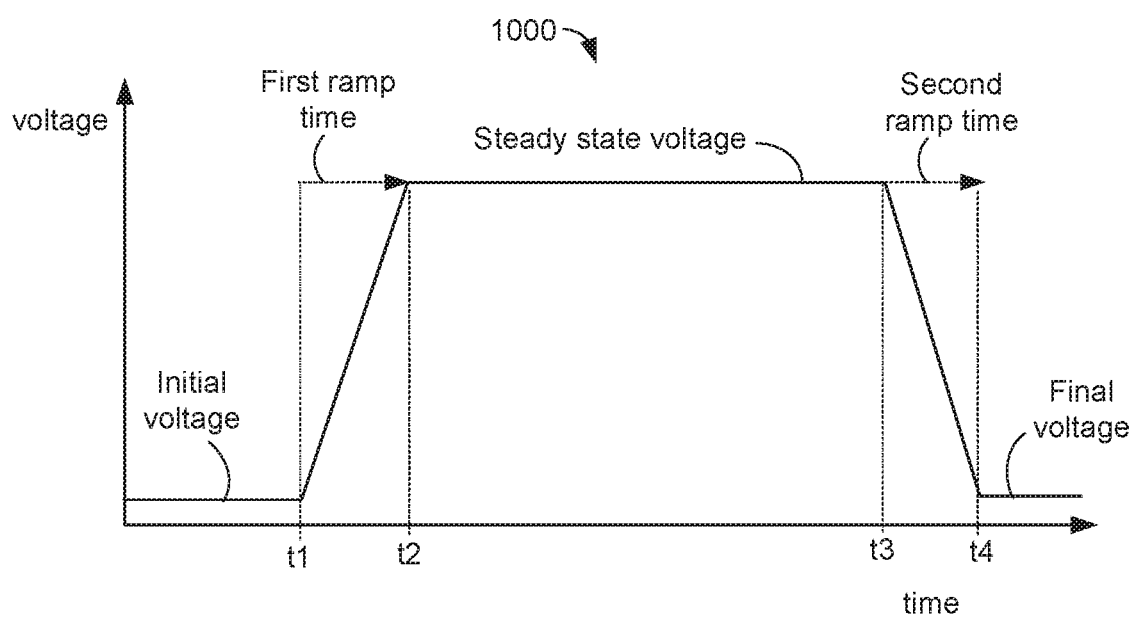
FIG. 10 depicts an example voltage pulse.

FIG. 10 depicts an example voltage pulse 1000. The voltage pulse 1000 has a first transient period between time t1 to time t2, a steady state period between time t2 to time t3, and a second transient period between time t3 to time t4. The voltage pulse 1000 changes (e.g., increases) from an initial voltage to a steady state voltage during a first transient period, first ramp time. The voltage pulse 1000 stays at the steady state voltage for a "pulse duration," which extends from time t2 to time t3. The voltage pulse 1000 changes (e.g., decreases) from the steady state voltage to a final voltage during a second transient period, second ramp time.

Note that although the pulse 1000 ramps down in voltage during the second transient period, the pulse could ramp up in the second transient period (in combination with also ramping up in the first transient period). Also note that the steady state voltage of a first voltage pulse may serve as the initial voltage for an immediately following voltage pulse. In this case, the second transient period of the first voltage pulse is also the first transient period of the immediately following voltage pulse. Moreover, in this case, the steady state voltage of the immediately following voltage pulse is the final voltage of first voltage pulse.

The start time of a voltage pulse is defined herein as the beginning of the first transient period, when the voltage first begins to change from the initial voltage. The end time of a voltage pulse is defined herein as the end of the second transient period, when the voltage first reaches the final voltage. The first ramp time of a voltage pulse is defined herein as the time to change from the initial voltage to the steady state voltage. The first ramp time may be a ramp-up in voltage or a ramp-down in voltage. The second ramp time of a voltage pulse is defined herein as the time to change from the steady state voltage to the final voltage. The second ramp time may be a ramp-up in voltage or a ramp-down in voltage. The term "ramp time" is used herein to refer to either the first ramp time or the second ramp time.

A voltage pulse attribute is defined herein as any attribute that describes the shape of a voltage pulse 1000. Examples of voltage pulse attributes include, but are not limited to, first ramp time, second ramp time, ramp-up time, ramp-down time, steady state magnitude, pulse duration, start time, end time, and the like.

The voltage pulse may be the electric potential relative to a common point in a circuit (e.g., ground). For example, a voltage pulse applied to a bit line may be the difference in electric potential of the bit line and the electric potential of a common point (e.g., ground). However, herein a voltage pulse is not required to be the electric potential relative to ground. A voltage pulse may be the difference in electric potential between any two points in a circuit. For example, a voltage pulse may be the difference in electric potential between the gate and drain of a transistor.

Figure 10A:
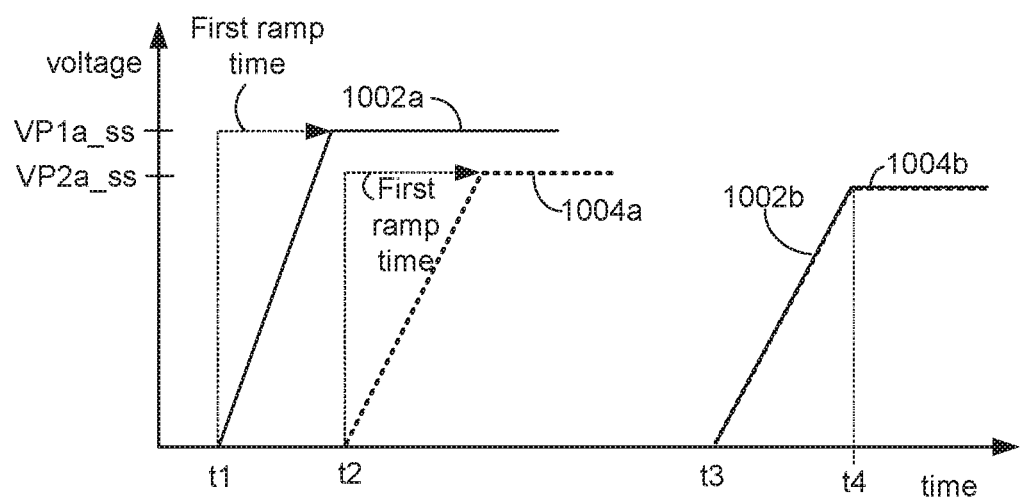
FIGS. 10A, 10B, and 10C depicts possible voltage pulses in embodiment of operating a memory device.

FIG. 10A depicts possible voltage pulses in one embodiment of operating the memory device of FIG. 9A or 9B. Note that to simplify the diagram only the first transient period and a portion of the steady state period is depicted. The second transient period is not depicted. This simplification applies to other voltage pulses depicted in the drawings. Voltage pulse 1002$a$ represents voltage pulse V_P1$a$ that is applied by P1 circuitry 922 to one end of pathway P1

906, in one embodiment. Voltage pulse 1004a represents voltage pulse V_P2a that is applied by P2 circuitry 924 to one end of pathway P2 908, in one embodiment.

Voltage pulse 1002a has a steady state magnitude of VP1a_ss. Voltage pulse 1004a has a steady state magnitude of VP2a_ss. The two voltage pulses 1002a, 1004a have different steady state magnitudes. Voltage pulse 1002a starts at time t1. Voltage pulse 1002a starts at time t2. The two voltage pulses 1002a, 1004a have different start times. The two voltage pulses 1002a, 1004a have different first ramp times. The dotted arrows lines labeled "first ramp time" represents the time to increase from the starting voltage to the steady state voltage. In FIG. 10A, the voltage pulses are somewhat simplified in that the voltage pulses are depicted with straight line segments. However, the voltage pulses may have segments with other than straight line segments. Note that the times t1-t4 in FIG. 10A do not correspond to times t1 to t4 in FIG. 10.

In this example, several of the pulse attributes (e.g., steady state magnitude, start time, and ramp time) of these voltage pulses 1002a, 1004a are different to compensate for different impedances of pathway P1 906 and pathway P2 908. In one embodiment, one or more of the pulse attributes (e.g., steady state magnitude, start time, and/or ramp time) of these voltage pulses are different to compensate for different impedances of pathway P1 906 and pathway P2 908. In one embodiment, at least one of the attributes of the voltage pulse applied to pathway P1 906 has a different value than the same attribute of the voltage pulse applied to pathway P2 908 such that the two voltage pulses are substantially symmetric at the respective terminals of the select transistors 680, 670.

Voltage pulse 1002b (solid line) represents the voltage V_P1b at the other end of pathway P1 906, in one embodiment. Thus, voltage pulse 1002b is applied to one terminal (e.g., drain) of select transistor 680. Voltage pulse 1004b (dotted line) represents the voltage V_P2b at the other end of pathway P2 908, in one embodiment. Thus, voltage pulse 1004b is applied to one terminal (e.g., drain) of select transistor 670. The two voltage pulses 1002b, 1004b have substantially the same steady state magnitude, substantially the same the same start time, and substantially the same the same first ramp time.

Herein, "substantially the same ramp time" of two voltage pulses means that time difference in ramp times of the two voltage pulses is less than 3% of the shorter of the two ramp times of the two voltage pulses. This may apply to either the first ramp time or the second ramp time (the comparison is with respect to either the first ramp time of each voltage pulse or the second ramp time of each voltage pulse). Two voltage pulses that do not have substantially the same ramp time are defined as having different ramp times. In one embodiment, the time difference in ramp times of the two voltage pulses 1002b, 1004b is less than 2% of the shorter of the two ramp times of the two voltage pulses. In one embodiment, the time difference in ramp times of the two voltage pulses 1002b, 1004b is less than 1% of the shorter of the two ramp times of the two voltage pulses.

Herein, "substantially the same start time of two voltage pulses" means that the time difference in start times of the two voltage pulses is less than 3% of the longer of the two first ramp times of the two voltage pulses. Two voltage pulses that do not have substantially the same start time are defined as having different start times. In one embodiment, the time difference in start times of the two voltage pulses is less than 2% of the longer of the two first ramp times of the two voltage pulses. In one embodiment, the time difference in start times of the two voltage pulses is less than 1% of the longer of the two first ramp times of the two voltage pulses.

The two voltage pulses 1002b, 1004b are substantially symmetric. The two voltage pulses 1002b, 1004b each have a first transient period, which is depicted between about times t3 to about t4. Note that the two pulses 1002b, 1004b do not necessarily both start at exactly the same time, or reach their steady state values at exactly the same time. In one embodiment, the difference in steady state voltage magnitudes of pulses 1002b, 1004b is within 2% of the larger steady state magnitude and the difference in voltage magnitudes during the first transient period are within 2% of the larger steady state magnitude. In one embodiment, the difference in steady state voltage magnitudes of pulses 1002b, 1004b are within 1% of the larger steady state magnitude and the difference in voltage magnitudes during the first transient period are within 1% of the larger steady state magnitude.

Figure 10B:
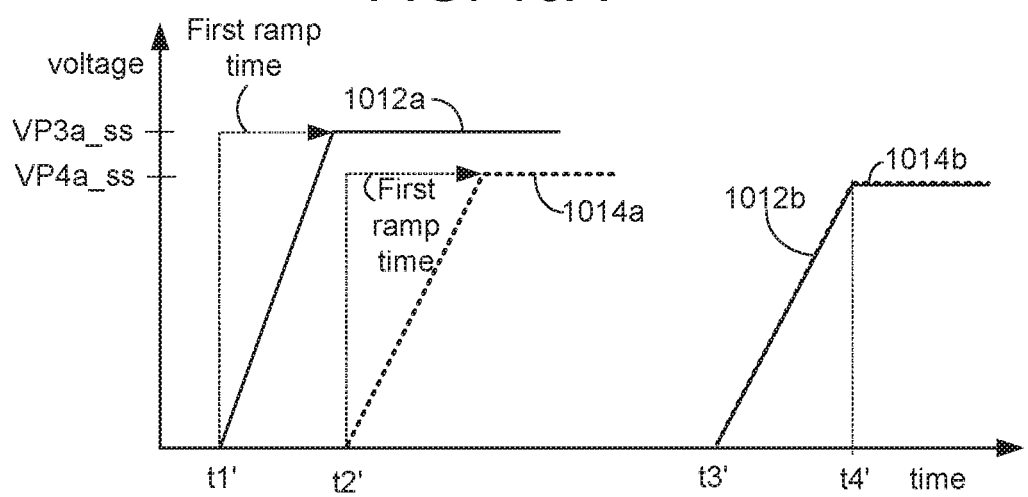

FIG. 10B depicts possible voltage pulses in one embodiment of operating the memory device of FIG. 9A or 9B. Voltage pulse 1012a represents voltage pulse V_P3a that is applied by P3 circuitry 926 to one end of pathway P3 910, in one embodiment. Voltage pulse 1014a represents voltage pulse V_P4a that is applied by P4 circuitry 928 to one end of pathway 912, in one embodiment.

Voltage pulse 1012a has a steady state magnitude of VP3a_ss. Voltage pulse 1014a has a steady state magnitude of VP4a_ss. The two voltage pulses 1012a, 1014a have different steady state magnitudes. Voltage pulse 1012a starts at time t1'. Voltage pulse 1012a starts at time t2'. The two voltage pulses 1012a, 1014a have different start times. The two voltage pulses 1012a, 1014a have different first ramp times.

In this example, several of the pulse attributes (e.g., steady state magnitude, start time, and first ramp time) of these voltage pulses 1012a, 1014a are different to compensate for different impedances of pathway P3 910 and pathway P4 912. In one embodiment, one or more of the pulse attributes (e.g., steady state magnitude, start time, and/or ramp time) of these voltage pulses are different to compensate for different impedances of pathway P3 910 and pathway P4 912. In one embodiment, at least one of the attributes of the voltage pulse applied to pathway P3 910 has a different value than the same attribute of the voltage pulse applied to pathway P4 912 such that the two voltage pulses are substantially symmetric at the respective terminals of the select transistors 680, 670.

Voltage pulse 1012b (solid line) represents the voltage V_P3b at the other end of pathway P3 910, in one embodiment. Thus, voltage pulse 1012b is applied to one terminal (e.g., drain) of select transistor 680. Voltage pulse 1014b (dotted line) represents the voltage V_P2b at the other end of pathway P4 912, in one embodiment. Thus, voltage pulse 1012b is applied to one terminal (e.g., drain) of select transistor 670. The two voltage pulses 1012b, 1014b have substantially the same steady state magnitude, substantially the same the same start time, and substantially the same the same first ramp time.

In one embodiment, the time difference in first ramp times of the two voltage pulses 1012b, 1014b is less than 2% of the shorter of the two first ramp times of the two voltage pulses. In one embodiment, the time difference in first ramp times of the two voltage pulses 1012b, 1014b is less than 1% of the shorter of the two first ramp times of the two voltage pulses.

In one embodiment, the time difference in start times of the two voltage pulses 1012b, 1014b is less than 2% of the shorter of the two first ramp times of the two voltage pulses.

In one embodiment, the time difference in start times of the two voltage pulses 1012b, 1014b is less than 1% of the shorter of the two first ramp times of the two voltage pulses.

The two voltage pulses 1012b, 1014b are substantially symmetric. The two voltage pulses 1012b, 1014b each have a first transient period, which is depicted between about times t3' to about t4'. Note that the two pulses 1012b, 1014b do not necessarily both start at exactly the same time, or reach their steady state values at exactly the same time. In one embodiment, the difference in steady state voltage magnitudes of pulses 1012b, 1014b is within 2% of the larger steady state magnitude and the difference in voltage magnitudes during the first transient period are within 2% of the larger steady state magnitude. In one embodiment, the difference in steady state voltage magnitudes of pulses 1012b, 1014b is within 1% of the larger steady state magnitude and the difference in voltage magnitudes during the first transient period are within 1% of the larger steady state magnitude.

Figure 10C:
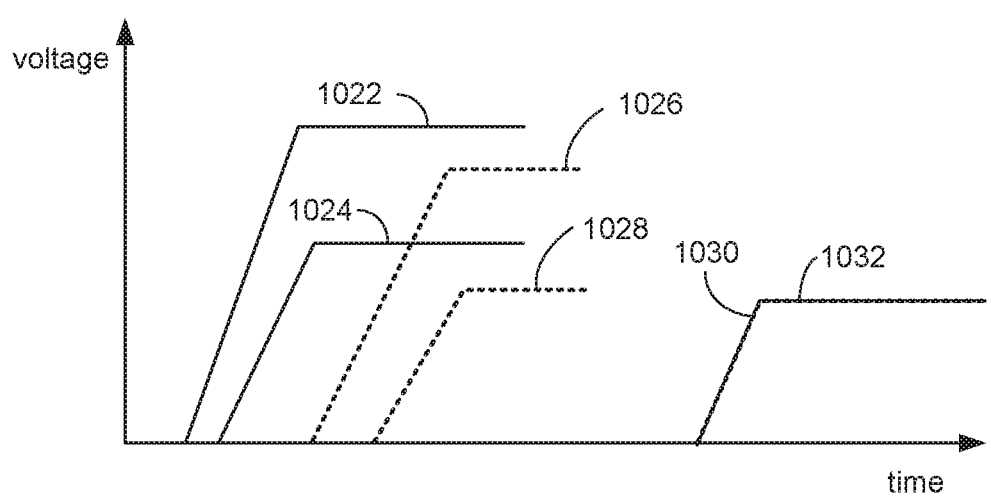

In one embodiment, the attributes of the voltage pulses that are applied to the various pathways 906, 908, 910, 912 have attributes that are configured such that the GIDL voltage (Vgidl_d) at transistor 680 and the GIDL voltage (Vgidl_s) at transistor 670 are substantially symmetric. FIG. 10C depicts possible voltage pulses in one embodiment of operating the memory device of FIG. 9A or 9B. Voltage pulse 1022 represents voltage pulse V_P1a that is applied by Pb circuitry 922 to one end of pathway 906, in one embodiment. Voltage pulse 1024 represents voltage pulse V_P3a that is applied by P3 circuitry 926 to one end of pathway P3 910, in one embodiment. Voltage pulse 1026 represents voltage pulse V_P2a that is applied by P2 circuitry 924 to one end of pathway 908, in one embodiment. Voltage pulse 1028 represents voltage pulse V_P4a that is applied by P4 circuitry 928 to one end of pathway 912, in one embodiment.

Voltage pulse 1030 (solid line) represents the voltage Vgidl_d that is between two terminals of select transistor 680, in one embodiment. For example, voltage pulse 1030 may be the drain to gate voltage of select transistor 680. Voltage pulse 1032 (dotted line) represents the voltage Vgidl_ds that is between two terminals of select transistor 670, in one embodiment. For example, voltage pulse 1032 may be the drain to gate voltage of select transistor 670.

The values for various attributes (e.g., start time, steady state magnitude, first ramp time) of voltage pulses 1022, 1024, 1026, and/or 1026 are selected such that voltage pulse 1030 and voltage pulse 1032 are substantially symmetric, in one embodiment. In one embodiment, the difference in steady state voltage magnitudes of pulses 1030, 1032 is within 2% of the larger steady state magnitude and the difference in voltage magnitudes during the first transient period are within 2% of the larger steady state magnitude. In one embodiment, the difference in steady state voltage magnitudes of pulses 1030, 1032 is within 1% of the larger steady state magnitude and the difference in voltage magnitudes during the first transient period are within 1% of the larger steady state magnitude.

In one embodiment, the steady state magnitudes of voltage pulse 1022 is substantially the same as the steady state magnitudes of voltage pulse 1026; however, the steady state magnitudes of voltage pulse 1024 is different from the steady state magnitude of voltage pulse 1028. This combination of voltages results in the steady state magnitudes of voltage pulses 1030 and 1032 being substantially the same, in one embodiment. The different steady state magnitudes of voltage pulse 1024 and voltage pulse 1028 may compensate for impedance differences of the first pathway P1 906 and the second pathway 908. The different steady state magnitudes of voltage pulses 1024 and 1028 are selected such that voltage pulse 1030 and voltage pulse 1032 are substantially symmetric, in one embodiment.

In one embodiment, the start time of voltage pulse 1022 is substantially the same as the start time of voltage pulse 1026; however, the start times of voltage pulse 1024 is different from the start time of voltage pulse 1028. The different start times of voltage pulse 1024 and voltage pulse 1028 may compensate for impedance differences of the first pathway P1 906 and the second pathway 908. The different start times of voltage pulses 1024 and 1028 are selected such that voltage pulse 1030 and voltage pulse 1032 are substantially symmetric, in one embodiment. The different start times of voltage pulses 1024 and 1028 are selected such that voltage pulse 1030 and voltage pulse 1032 start at substantially the same time, in one embodiment. The different start times of voltage pulses 1024 and 1028 are selected such that voltage pulse 1030 and voltage pulse 1032 have substantially the same steady state magnitudes, in one embodiment In one embodiment, both the start time and the steady state magnitude of voltage pulses 1022 and 1026 are substantially the same; however, both the start times and the steady state magnitudes of voltage pulses 1024 and 1028 are different from each other. The different start times and steady state magnitudes of voltage pulses 1024 and 1028 may compensate for impedance differences of the first pathway P1 906 and the second pathway 908. The different start times and steady state magnitudes of voltage pulses 1024 and 1028 are selected such that voltage pulse 1030 and voltage pulse 1032 are substantially symmetric, in one embodiment.

Other voltage pulse attributes can also be used to, for example, compensate for different impedances. In one embodiment, the end time of two voltage pulses are used to compensate for impedance differences of the first pathway P1 906 and the second pathway 908. For example, the end time could be different as applied to the first pathway P1 906 and the second pathway 908, but substantially the same at the select transistors. Herein, "substantially the same end time of two voltage pulses" means that the time difference in end times of the two voltage pulses is less than 3% of the shorter of the two second ramp times of the two voltage pulses. Two voltage pulses that do not have substantially the same end time are defined as having different end times. In one embodiment, the time difference in end times of the two voltage pulses is less than 2% of the shorter of the two second ramp times of the two voltage pulses. In one embodiment, the time difference in end times of the two voltage pulses is less than 1% of the shorter of the two second ramp times of the two voltage pulses.

In one embodiment, two different voltage pulses applied to two of the pathways P1 906, P2 908, P3 910, P4 912 have different pulse attributes to achieve substantially the same pulse duration of two voltage pulses at the select transistors. Herein, "substantially the same pulse duration of two voltage pulses" means that the time difference in pulse duration of the two voltage pulses is less than 3% of the shorter of the two pulse durations. In one embodiment, the difference in pulse durations of the two voltage pulses at the select transistors is less than 2% of the shorter of the two pulse durations. In one embodiment, the difference in pulse durations of the two voltage pulses at the select transistors is less than 1% of the shorter of the two pulse durations.

Figure 11:
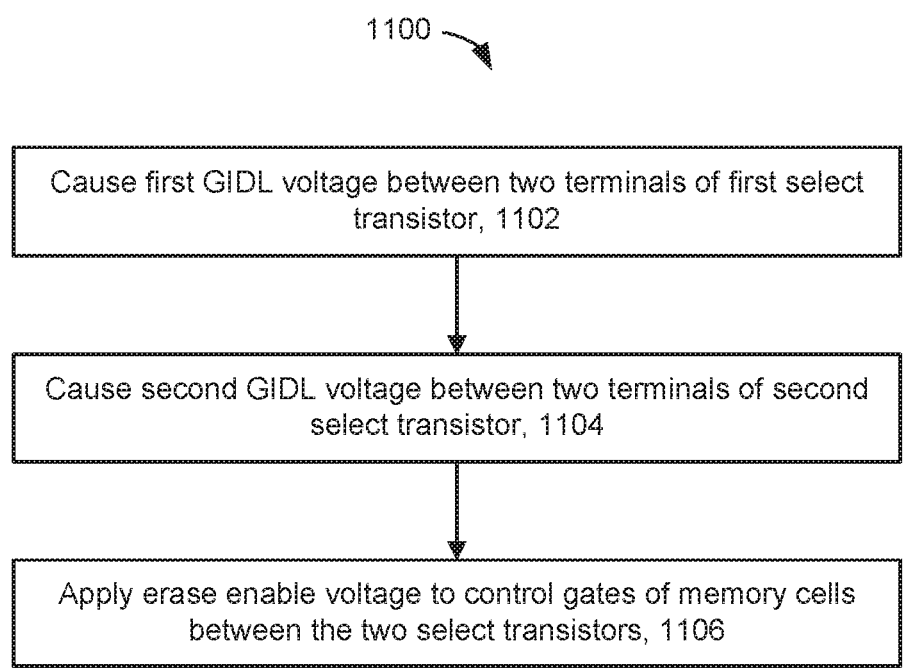
FIG. 11 is a flowchart of one embodiment of a process of a two-sided GIDL erase.

FIG. 11 is a flowchart of one embodiment of a process 1100 of a two-sided GIDL erase. The process 1100 is used to erase memory cells that are connected between two select transistors 680, 670, in one embodiment. Reference will be made to the circuit of FIG. 9A when discussing process 1100; however, process 1100 is not limited to the circuit of FIG. 9A. The process 1100 is used to erase a NAND string of memory cells, in one embodiment. The NAND string is in a three-dimensional memory array, in one embodiment. Process 1100 may be performed by control circuit of memory device 100. For example, process 1100 may be performed by state machine 112 and/or controller 122 (or equivalently functioned circuits), in combination with all or a subset of the other circuits depicted in FIG. 1. In one embodiment, state machine 112 instructs voltage circuitry (e.g., P1 circuitry 922, P2 circuitry 924, P3 circuitry 926, and/or P4 circuitry 928) to apply voltage pulses to various pathways (or in some cases to leave the voltage floating).

Step 1102 includes causing a first GIDL voltage between two terminals of a first select transistor 680. Step 1102 may include a state machine 112 (or other circuitry or logic) instructing a voltage circuit to apply one or more voltages to one or more pathways. For example, state machine 112 may instruct P1 circuitry 922 to apply voltage V_P1a to the first pathway P1 906 and P3 circuitry 926 to apply voltage V_P3a to the third pathway P3 910, in one embodiment. State machine 112 may control the timing such that P1 circuitry 922 applies voltage V_P1a to the first pathway P1 906 while P3 circuitry 926 applies voltage V_P3a to the third pathway P3 910. Therefore, the first GIDL voltage is given by V_P1b-V_P3b. Note that both V_P1a and V_P3b may have a transient component and a steady state component.

Step 1102 includes P1 circuitry 922 applying voltage V_P1a to first pathway P1 906 while P3 circuitry 926 allows the voltage on the third pathway P3 910 to float, in one embodiment. In this case, the voltage on the terminal (e.g., gate terminal) of select transistor 680 that is connected to the third pathway P3 910 may increase due to capacitive coupling. The net result is that the first GIDL voltage is given by V_P1b minus the floating voltage on the gate terminal of select transistor 680.

Step 1104 includes causing a second GIDL voltage between two terminals of a first select transistor 680. Step 1104 may include a state machine 112 instructing the voltage circuit to apply one or more voltages to one or more pathways. For example, state machine 112 may instruct P2 circuitry 924 to apply voltage V_P2a to the second pathway P2 908, and instruct P4 circuitry 928 to apply voltage V_P4a to the fourth pathway P4 912, in one embodiment. State machine 112 may control the timing such that P2 circuitry 924 applies voltage V_P2a to the second pathway P2 908 while P4 circuitry 928 applies voltage V_P4a to the fourth pathway P4 912. Therefore, the second GIDL voltage is given by V_P2b-V_P4b. Note that both V_P2a and V_P4b may have first and second transient periods and a steady state period.

Step 1104 includes P2 circuitry 924 applying voltage V_P2a to second pathway P2 908 while P4 circuitry 928 allows the voltage on the fourth pathway P4 912 to float, in one embodiment. In this case, the voltage on the terminal (e.g., gate terminal) of select transistor 670 that is connected to the fourth pathway P4 912 may increase due to capacitive coupling. The net result is that the second GIDL voltage is given by V_P2b minus the floating voltage on the gate terminal of select transistor 670. Note that when the third pathway P3 910 and the fourth pathway P4 912 are left floating, factors such as the initial voltage on the pathways P3 910, P4 912 and/or the floating time can be used to achieve different voltages at the first and second select transistors 680, 670. For example, using different initial voltages on the pathways P3 910, P4 912 can result in different floating voltage during the first transient period.

Step 1102 results in a first GIDL voltage (e.g., Vgidl_d). Step 1104 results in a second GIDL voltage (e.g., Vgidl_s). In one embodiment, the first GIDL voltage (e.g., Vgidl_d) is substantially symmetric with the second GIDL voltage (e.g., Vgidl_s). In one embodiment, the steady state magnitude of the first GIDL voltage is substantially the same as the steady state magnitude of the second GIDL voltage. In one embodiment, both the start time and the steady state magnitude of the first GIDL voltage are substantially the same as the start time and the steady state magnitude of the second GIDL voltage.

Step 1102 results in a first GIDL current (e.g., Igidl_d). Step 1104 results in a second GIDL current (e.g., Igidl_s). In one embodiment, the magnitude of the first GIDL current (e.g., Igidl_d) is substantially the same as the magnitude of the second GIDL current (e.g., Igidl_s) during the first transient periods and the steady state periods of the first and the second GIDL voltages. In one embodiment, the first GIDL current (e.g., Igidl_d) is substantially symmetric with the second GIDL current (e.g., Igidl_s). In one embodiment, both the start time and the steady state magnitude of the first GIDL current are substantially the same time as the start time and the steady state magnitude of the second GIDL current.

In one embodiment, the steady state magnitudes of the first and second GIDL voltages (at the terminals of the select transistors) are different from each other; however, the magnitudes of the first and second GIDL currents are substantially the same during the steady state periods of the first and the second GIDL voltages. In one embodiment, the steady state magnitudes of the first and second GIDL voltages (at the terminals of the select transistors) are different from each other; however, the magnitudes of the first and second GIDL currents are substantially the same during the first transient periods and the steady state periods of the first and the second GIDL voltages. This may be used to compensate for structural differences at each end of the NAND string. Such structural differences could result in different GIDL currents for the two select transistors 680, 670 even if the steady state GIDL voltages have the same magnitude.

In one embodiment, the steady state magnitudes of V_P1a-V_P3a is different than the steady state magnitudes of V_P2a-V_P4a; however, the magnitudes of the first and second GIDL currents are substantially the same during the steady state periods of V_P1a-V_P3a and V_P2a-V_P4a. In one embodiment, the steady state magnitudes of V_P1a-V_P3a is different than the steady state magnitudes of V_P2a-V_P4a; however, the magnitudes of the first and second GIDL currents are substantially the same during both the first transient periods and the steady state periods of V_P1a-V_P3a and V_P2a-V_P4a. This may be used to compensate for impedance differences at each end of the NAND string. For example, this may be used to compensate for impedance mismatches between pathway P1 906 and pathway P2 908. As another example, this may be used to compensate for impedance mismatches between pathway P2 910 and pathway P4 912. Such impedance mismatches could result in different GIDL currents for the two select transistors 680, 670 even if the steady state magnitude of V_P1a-V_P3a is the same as the steady state magnitude of V_P2a-V_P4a.

In one embodiment, steps 1002 and 1104 include applying voltages having substantially the same magnitude to a first end of pathway P1 906 and to a first end of a pathway P2

908. For example, V_P1*a* and V_P2*a* have the substantially same magnitude, in one embodiment. V_P1*a* and V_P2*a* have substantially the same start time and substantially the same steady state magnitude, in one embodiment. Steps 1002 and 1104 also include applying voltages having different magnitudes to a first end of pathway P3 910 and to a first end of a pathway P4 912. For example, voltages V_P3*a* and V_P4*a* have different magnitudes. Voltages V_P3*a* and V_P4*a* have different start times and different steady state magnitudes, in one embodiment. Applying the voltages to pathways P1 906, P2 908, P3 910, and P4 912 results in substantially the same voltage between two terminals of SGD transistor 680 and SGS transistor 670, in one embodiment. For example, with reference to FIG. 9A, Vgidl_d has substantially the same magnitude as Vgidl_s. In one embodiment, Vgidl_d and Vgidl_s have substantially the same start times and substantially the same steady state magnitudes.

Step 1106 includes applying an erase enable voltage to control gates of memory cells between the two select transistors 680, 670. Step 1106 is performed while causing the first and second GIDL voltages. Step 1106 includes applying erase enable voltages to word lines that are connected to the control gates of the memory cells, in one embodiment. The erase enable voltage has a steady state magnitude between 0V to 0.5V, in one embodiment. The steady state magnitude of the erase enable voltage could be higher than 0.5V.

Figure 12A:
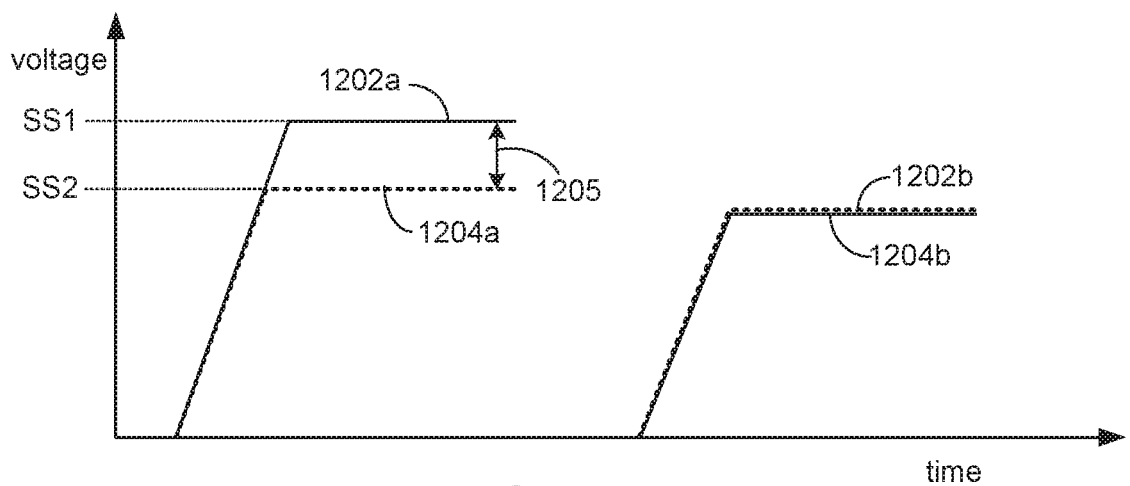
FIGS. 12A, 12B, and 12C depict voltage pulses of embodiments of two-sided GIDL erase.
Figure 12B:
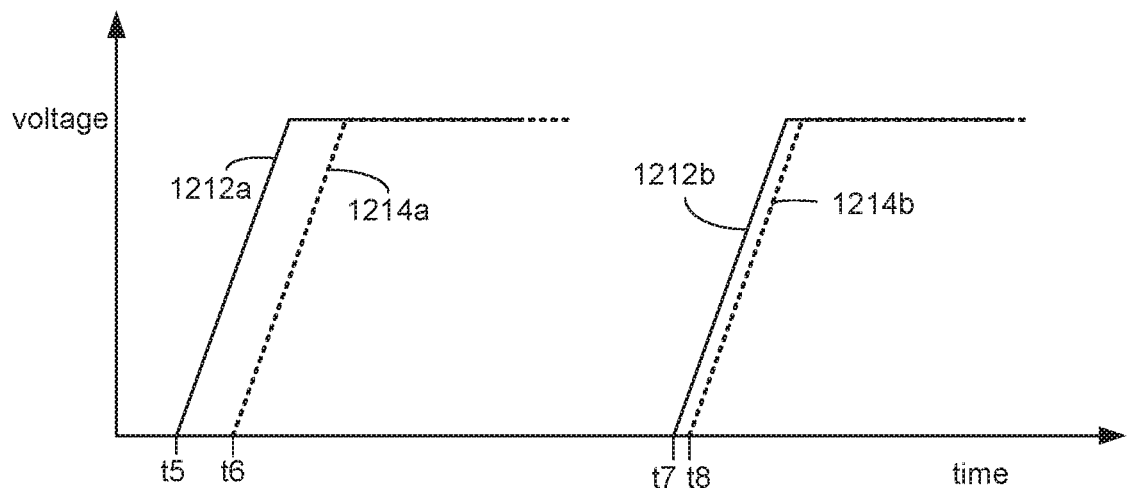
Figure 12C:
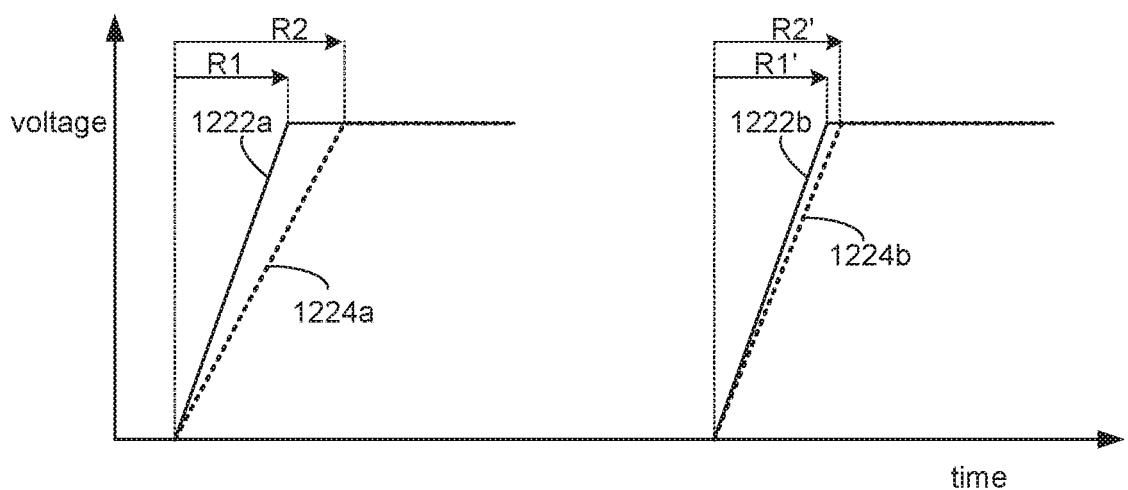

FIGS. 12A-12C depict voltage pulses to show further details of embodiments of two-sided GIDL erase. FIG. 12A depicts voltage pulses to show how a voltage pulse attribute of steady state magnitude can be configured in a two-sided GIDL erase. FIG. 12B depicts voltage pulses to show how a voltage pulse attribute of start time can be configured in a two-sided GIDL erase. FIG. 12B depicts voltage pulses to show how a voltage pulse attribute of ramp time can be configured in a two-sided GIDL erase.

Referring now to FIG. 12A, voltage pulse 1202*a* represents voltage pulse V_P1*a* that is applied by P1 circuitry 922 to one end of pathway 906, in one embodiment. Voltage pulse 1204*a* represents voltage pulse V_P2*a* that is applied by P2 circuitry 924 to one end of pathway 908, in one embodiment. The two voltage pulses 1202*a*, 1204*a* have different steady state magnitudes (SS1, SS2). The difference in steady state magnitudes is represented by double headed arrow 1205. In one embodiment, the steady state magnitudes of these voltage pulses are different to compensate for different impedances of pathway P1 906 and pathway P2 908.

Voltage pulse 1202*b* represents voltage pulse V_P1*b* that arrives at the other end of pathway 906, in one embodiment. Thus, voltage pulse V_P1*b* is applied to one terminal (e.g., drain) of select transistor 680. Voltage pulse 1204*b* represents voltage pulse V_P2*b* that arrives at the other end of pathway 908, in one embodiment. Thus, voltage pulse V_P2*b* is applied to one terminal (e.g., drain) of select transistor 670. The difference in steady state magnitude between pulses 1202*b* and 1204*b* is less than the difference in steady state magnitude between pulses 1202*a* and 1204*a*. The two voltage pulses 1202*b*, 1204*b* have substantially the same steady state magnitudes (at the respective select transistors 680, 670). Note that the magnitude gap between pulse 1202*b* and 1204*b* may be exaggerated so that a magnitude gap can be seen in the Figure.

FIG. 12B depicts possible voltage pulses in one embodiment of operating the memory device of FIG. 9A or 9B. Voltage pulse 1212*a* represents voltage pulse V_P1*a* that is applied by P1 circuitry 922 to one end of pathway 906, in one embodiment. Voltage pulse 1214*a* represents voltage pulse V_P2*a* that is applied by P2 circuitry 924 to one end of pathway 908, in one embodiment. The two voltage pulses 1212*a*, 1214*a* have the same steady state magnitudes, but different start times. In this embodiment, the start time of these voltage pulses are different to compensate for different impedances of pathway P1 906 and pathway P2 908. Pulse 1212*a* starts at time t4, whereas pulse 1214*a* starts at time t6.

Voltage pulse 1212*b* represents voltage pulse V_P1*b* that arrives at the other end of pathway 906, in one embodiment. Thus, voltage pulse V_P1*b* is applied to one terminal (e.g., drain) of select transistor 680. Voltage pulse 1014*b* represents voltage pulse V_P2*b* that arrives at the other end of pathway 908, in one embodiment. Thus, voltage pulse V_P2*b* is applied to one terminal (e.g., drain) of select transistor 670. Voltage pulse 1212*b* starts at time t6, whereas voltage pulse 1214*b* starts at time t8. The gap in time between t7 and t8 is less than the gap in time between t5 and t6. The two voltage pulses 1212*b*, 1214*b* have substantially the same start time (at the respective select transistors 670, 670). Note that the time gap between t7 and t8 may be exaggerated so that a time gap can be seen in the Figure.

FIG. 12C depicts possible voltage pulses in one embodiment of operating the memory device of FIG. 9A or 9B. Voltage pulse 1222*a* represents voltage pulse V_P1*a* that is applied by P1 circuitry 922 to one end of pathway 906, in one embodiment. Voltage pulse 1224*a* represents voltage pulse V_P2*a* that is applied by P2 circuitry 924 to one end of pathway 908, in one embodiment. The two voltage pulses 1222*a*, 1224*a* have the same steady state magnitudes and start times, but different first ramp times. In this embodiment, the first ramp times of these voltage pulses are different to compensate for different impedances of pathway P1 906 and pathway P2 908. Voltage pulse 1222*a* has a first ramp time of R1, whereas voltage pulse 1224*a* has a first ramp time of R2.

Voltage pulse 1222*b* represents voltage pulse V_P1*b* that arrives at the other end of pathway 906, in one embodiment. Thus, voltage pulse V_P1*b* is applied to one terminal (e.g., drain) of select transistor 680. Voltage pulse 1224*b* represents voltage pulse V_P2*b* that arrives at the other end of pathway 908, in one embodiment. Thus, voltage pulse V_P2*b* is applied to one terminal (e.g., drain) of select transistor 670. The two voltage pulses 1222*b*, 1224*b* have substantially the first ramp times R1', R2'. The time difference between R2' and R1' is less than the time difference between R2 and R1. Note that the differences in first ramp time may be exaggerated so that a ramp time gap can be seen in the Figure.

The concepts in FIGS. 12A-12C may also be applied to the third pathway P3 910 and the fourth pathway P4 912. Thus, with reference to FIG. 12A, voltage pulse 1202*a* represents V_P3*a*, voltage pulse 1204*a* represents V_P4*a*, voltage pulse 1202*b* represents V_P3*b*, and voltage pulse 1204*b* represents V_P4*b*, in one embodiment. With reference to FIG. 12B, voltage pulse 1212*a* represents V_P3*a*, voltage pulse 1214*a* represents V_P4*a*, voltage pulse 1212*b* represents V_P3*b*, and voltage pulse 1214*b* represents V_P4*b*, in one embodiment. With reference to FIG. 12C, voltage pulse 1222*a* represents V_P3*a*, voltage pulse 1224*a* represents V_P4*a*, voltage pulse 1222*b* represents V_P3*b*, and voltage pulse 1202*b* represents V_P4*b*, in one embodiment.

FIGS. 12A-12C each focus on one voltage pulse attribute to show how the voltage pulses at the select transistors can be impacted. The concepts in FIGS. 12A-12C may be combined. In one embodiment, the concepts in FIGS. 12A and 12B are combined (by using different initial steady state magnitudes and start times) such that both steady state magnitude and start time at the select transistors are substantially the same. In one embodiment, the concepts in FIGS. 12A and 12C are combined (by using different initial steady state magnitudes and first ramp times) such that both steady state magnitude and first ramp time at the select transistors are substantially the same. In one embodiment, the concepts in FIGS. 12B and 12C are combined (by using different first ramp times and start times) such that both start time and ramp time at the select transistors are substantially the same. In one embodiment, the concepts in FIGS. 12A, 12B and 12C are combined (by using different initial steady state magnitudes start times, and first ramp times) such that steady state magnitude, start time and first ramp time at the select transistors are substantially the same.

Figure 13A:
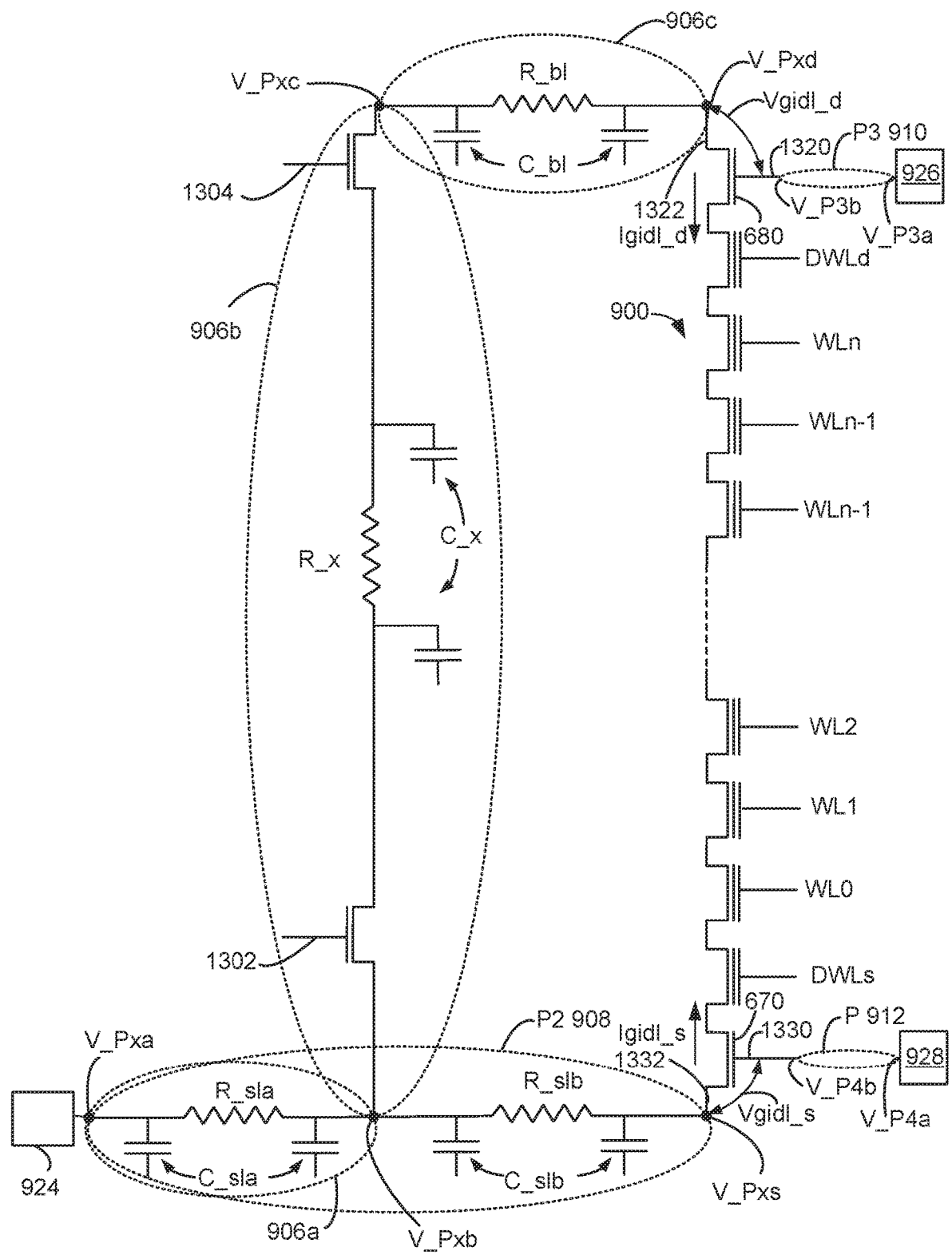
FIGS. 13A and 13B are schematic diagrams of embodiments of a NAND string and pathways connected to select transistors.

FIG. 13A is a schematic diagram of one embodiment of a NAND string and pathways connected to select transistors. The NAND string 900 is similar to the string of FIG. 9A. The pathways differ from the pathways in FIG. 9A in that the same voltage is applied to both the pathway P1 906 connected to the first transistor 680 and the pathway P2 908 connected to the second transistor 670. The NAND string in FIG. 13A may be implemented with the NAND string depicted in FIGS. 4, 6A, and 6B, in one embodiment. However, the NAND string in FIG. 13A is not limited to the NAND string depicted in FIGS. 4, 6A, and 6B.

Pathway P1 906 is divided into three sections 906a, 906b, and 906c. Section 906a has an impedance, which is represented by R_sla and C_sla. Section 906b has an impedance, which is represented by R_x and C_x. Section 906c has an impedance, which is represented by R_bl and C_bl. Section 906a is connected to P2 circuitry 924 and may include a portion of the source line. Section 906c includes the bit line and is connected to one terminal of select transistor 680. Section 906b includes transistors 1302 and 1304, as well as an electrically conductive pathway.

Pathway P2 908 is connected to one terminal (e.g., drain terminal) of the second select transistor 670. Pathway P2 908 includes the source line, in one embodiment. In one embodiment, the source line is buried in the substrate below the NAND string. Pathway P2 908 may include other elements such as switches (e.g., transistors). Pathway P2 908 is divided into two sections in FIG. 13A. One section has an impedance, which is represented by resistance (R_sla) and a capacitance (C_sla). Another section has an impedance, which is represented by resistance (R_slb) and a capacitance (C_slb). Resistances (R_sla, R_slb) and capacitances (C_sla, C_slb) include a source line resistance and a source line capacitance, in one embodiment.

P2 circuitry 924 is configured to apply a voltage pulse V_Pxa to one end of pathway P2 908. P2 circuitry 924 may be any electrical component that is capable of providing a voltage. The voltage is relative to some common point, such as ground. P2 circuitry 924 may include one or more charge pumps. Due to the impedance of pathway P2 908, there may be an RC delay along the pathway P2 908. Due to the impedance of pathway P2 908, there may be a voltage drop along the pathway P2 908. The voltage pulse is referred to as V_Pxd where section 906a and 906b meet. The voltage pulse is referred to as V_Pxs at the other end of the pathway P2 908. The voltage pulse is referred to as V_Pxc where sections 906b and 906c meet. The voltage pulse is referred to as V_Pxd where section 906c connects to the first select transistor 680.

Transistors 1302 and 1304 are used to provide a voltage to the first select transistor 680 along pathway 906. Transistor 1302 is used to access voltage V_Pxb, and provide a version of V_Pxb to transistor 1304. The version of the voltage V_Pxb that is provided transistor 1304 may be delayed and/or reduced in magnitude (relative to the version accessed by transistor 1302) due to the impedance. Transistor 1304 is used to provide voltage V_Pxc to one end of section 906c.

Pathways P3 910 and P4 912 are not depicted in FIG. 13A. However, pathways P3 910 and P4 912, as well as P3 circuitry 926 and P4 circuitry 928 may also be used with the configuration of FIG. 13A.

Therefore, voltage V_Pxd is applied to one terminal (e.g., drain) of transistor 680. Another voltage may be applied to another terminal (e.g., gate) of transistor 680 via the select line SGD. Therefore, a GIDL voltage Vgidl_d may be provided to the first select transistor 680. In one embodiment, the select line SGD is left floating. However, via capacitive coupling the voltage on the gate of transistor 680 rises such that the GIDL voltage Vgidl_d may be caused at the first select transistor.

Also, voltage V_Pxs is applied to one terminal (e.g., drain) of transistor 670. Another voltage may be applied to another terminal (e.g., gate) of transistor 670 via the select line SGS. Therefore, a GIDL voltage Vgidl_s may be provided to the first select transistor 680. In one embodiment, the select line SGS is left floating. However, via capacitive coupling the voltage on the gate of transistor 670 rises such that the GIDL voltage Vgidl_s may be caused at the first select transistor.

The impedances of pathways P1 906 and P2 908 may be different from each other. In one embodiment, voltage pulses that are applied to the SGD select line and the SGS select line at each end of the NAND string are configured to compensate for different impedances of pathway P1 906 and pathway P2 908. For example, the voltage pulses applied to the SGD select line and the SGS select line may have different values for one or more voltage pulse attributes (e.g., start time, ramp time, steady state magnitude).

In one embodiment, a control circuit applies substantially symmetric voltage pulses to pathways P1 906 and P2 908 that result in asymmetric voltage pulses at the terminals of select transistor 680 and select transistor 670. For example, the same voltage (V_Pxa) may be applied to both pathway P1 906 and P2 908. However, the waveforms of voltage V_Pxd and V_Pxs are asymmetric voltage pulses due to different impedances of pathway P1 906 and P2 908, in one embodiment. The control circuit also applies asymmetric voltage pulses to pathways P3 910 and P4 912 that result in Vgidl_d and Vgidl_s being substantially symmetric voltage pulses, in one embodiment.

Figure 13B:
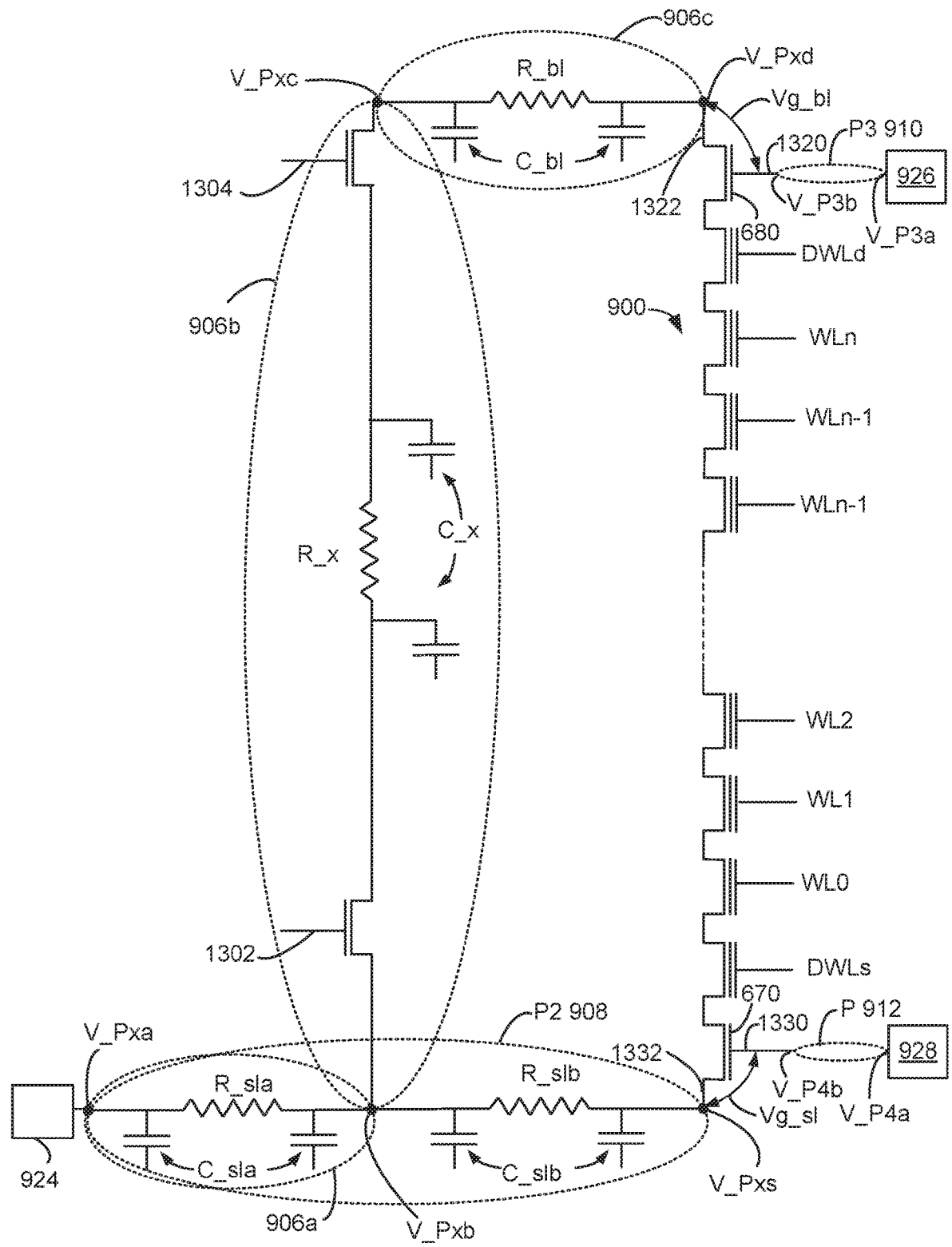

Note that although the example in FIG. 13A is with respect to creating GIDL voltages, the voltages are not required to be GIDL voltages. FIG. 13B is a schematic diagram of one embodiment of a NAND string and pathways connected to select transistors. The NAND string 900 is similar to the string of FIG. 13A. However, a GIDL voltage and GIDL current are not generated in this embodiment. The voltage between the gate terminal 1320 to bit line terminal 1322 for select transistor 680 is labeled as Vg_bl. The voltage between the gate terminal 1330 to bit line terminal 1332 for select transistor 670 is labeled as Vg_sl. The gate terminal 1320 to bit line terminal 1322 for select transistor 680 has substantially the same steady state magnitude as the gate terminal 1330 to bit line terminal 1332 voltage for select transistor 670, in one embodiment. The gate terminal 1320 to bit line terminal 1322 voltage for select transistor 680 is a first voltage pulse, and the gate terminal 1330 to bit line terminal 1332 voltage for select transistor 670 is a second voltage pulse, in one embodiment. The first voltage pulse and the second voltage pulse are substantially symmetric voltage pulses, in one embodiment.

Figure 14A:
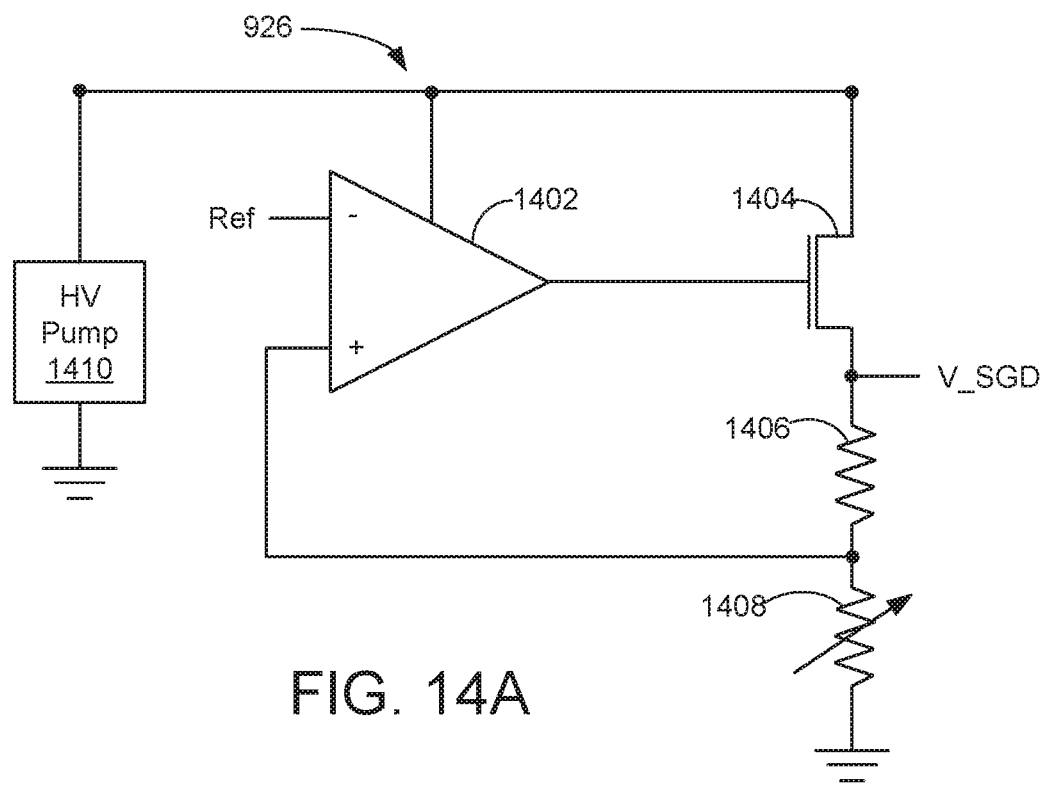
FIGS. 14A and 14B are diagrams of embodiments of circuitry that is configured to provide a voltage pulse to a select line.

FIG. 14A is a diagram of one embodiment of P3 circuitry 926 that is configured to provide a voltage pulse to an SGD select line. The P3 circuitry 926 may be used to provide a voltage pulse to the SGD select line in FIG. 13A. The P3 circuitry 926 includes a high voltage (HV) pump 1410, an operational amplifier 1402, transistor 1404, fixed value resistor 1406, and variable value resistor 1408. The P3 circuitry 926 has an output that provides voltage V_SGD, which may be provided to the SGD select line. In one embodiment, V_SGD is provided to the pathway P3 910.

The HV pump 1410 may include one or more charge pumps and is configured to provide high voltages. The HV pump 1410 provides a high voltage to the operational amplifier 1402. The operational amplifier 1402 output is connected to the gate of transistor 1404. The inverting input of the operational amplifier 1402 is provided with a reference voltage (Ref). The non-inverting input of the operational amplifier 1402 is connected between the fixed value resistor 1406 and the variable value resistor 1408. The value of the variable value resistor 1408 may be adjusted to adjust the magnitude of V_SGD.

Figure 14B:
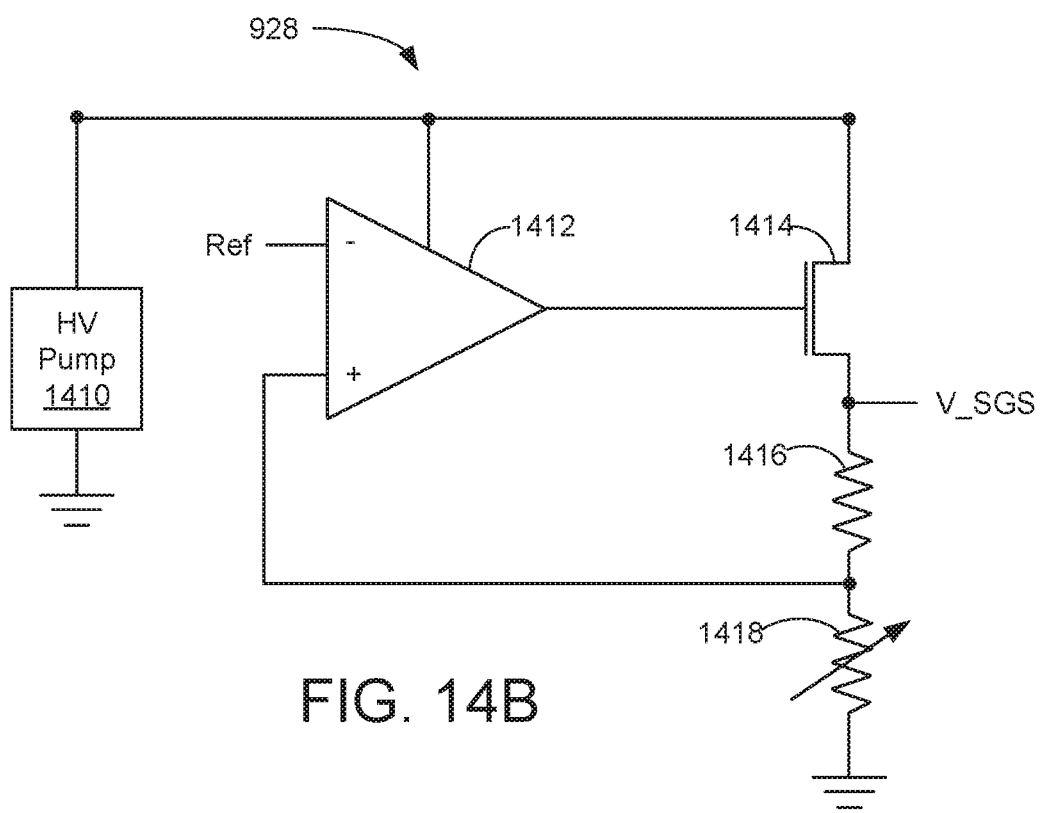

FIG. 14B is a diagram of one embodiment of P4 circuitry 928 that is configured to provide a voltage pulse to an SGS select line. The P4 circuitry 928 may be used to provide a voltage pulse to the SGS select line in FIG. 13A. The P4 circuitry 928 includes a high voltage (HV) pump 1410, an operational amplifier 1412, transistor 1414, fixed value resistor 1416, and variable value resistor 1418. The P4 circuitry 928 has an output that provides voltage V_SGS, which may be provided to the SGS select line. In one embodiment, V_SGS is provided to the pathway P4 912.

The HV pump 1410 may be the same HV pump 1410 that is used with the P3 circuitry 926. The HV pump 1410 may provide the same voltage to both P3 circuitry 926 and P4 circuitry 928. However, it is not required that HV pump 1410 provide the same voltage to both P3 circuitry 926 and P4 circuitry 928. The operation of P4 circuitry 928 is similar to P3 circuitry 926. The value of fixed value resistor 1416 may be equal to the value of fixed value resistor 1406. However, variable value resistor 1418 may be set to a different resistance than variable value resistor 1408. Thus, even while using the same voltage from HV pump 1410, different magnitude voltages may be provided to the SGS select line and the SGD select line.

Figure 15A:
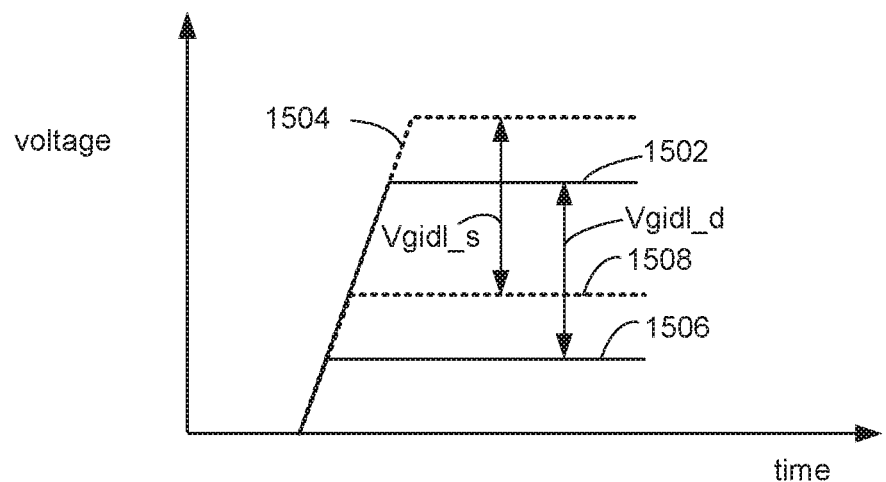
FIG. 15A is a graph of voltage pulses that occur at select transistors, in one embodiment of a two-sided GIDL erase.

FIG. 15A is a graph of voltage pulses that occur at the select transistors 680, 670 in one embodiment of a two-sided GIDL erase. The voltage pulses occur in one embodiment of operation of the circuit of FIG. 13A. Voltage pulse 1502 is the voltage V_pxd at one terminal (e.g., drain) of the first select transistor 680. Voltage pulse 1504 is the voltage V_pxs at one terminal (e.g., drain) of the second select transistor 670. Note voltage pulses 1502 and 1504 have different steady state magnitudes. This may be due to the different impedances (or impedance mismatch) between the first pathway P1 906 and the second pathway P2 908.

Voltage pulse 1506 is the voltage at the gate terminal of the first select transistor 680. The voltage Vgidl_d is the difference between the magnitudes of voltage pulse 1502 and voltage pulse 1506. Voltage pulse 1508 is the voltage the gate terminal of the second select transistor 670. The voltage Vgidl_s is the difference between the magnitudes of voltage pulse 1504 and voltage pulse 1508. The magnitude of voltage Vgidl_d is substantially equal to the magnitude of voltage Vgidl_s.

Note that graph of voltage pulses in FIG. 15A could apply to memory operations other than a two-sided GIDL erase. For example, these voltage pulses could occur during an erase that is not a GIDL erase. Thus, the voltage difference between voltage pulse 1504 and voltage pulse 1508 is not required to be a GIDL voltage. Likewise, the voltage difference between voltage pulse 1502 and voltage pulse 1506 is not required to be a GIDL voltage. Also, the voltage pulses could occur during memory array operations such as program or read. In one embodiment, the voltage difference between voltage pulse 1504 and voltage pulse 1508 is Vg_sl in FIG. 13B. In one embodiment, the voltage difference between voltage pulse 1502 and voltage pulse 1506 is Vg_bl in FIG. 13B.

Figure 15B:
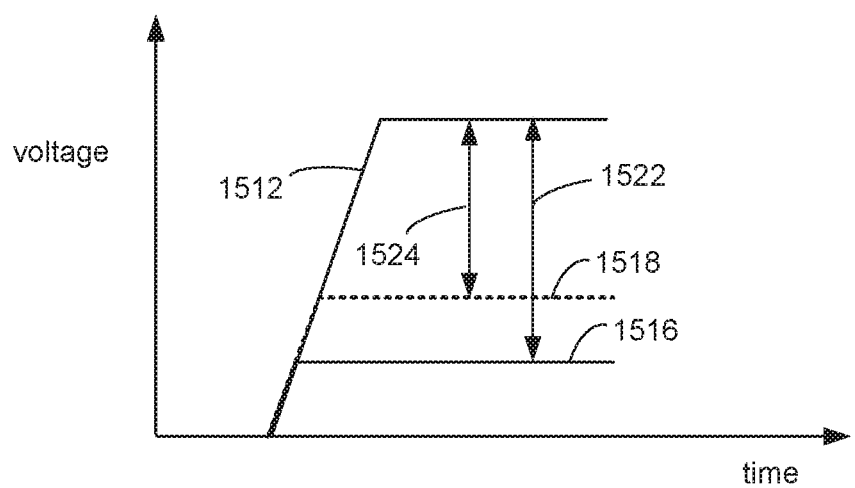
FIG. 15B is a graph of voltage pulses that are applied to pathways, in one embodiment of a two-sided GIDL erase.

FIG. 15B is a graph of voltage pulses that are applied to pathways, in one embodiment of a two-sided GIDL erase. The voltage pulses may be applied to various pathways to result in the voltage pulses of FIG. 15A. Voltage pulse 1512 is the voltage V_pxa, which is provided by P2 circuitry 924, in one embodiment. Voltage pulse 1516 is the voltage applied to the SGD select line, in one embodiment. Voltage pulse 1516 is provided to pathway P3 910 by P3 circuitry 926, in one embodiment. Voltage pulse 1518 is the voltage applied to the SGS select line, in one embodiment. Voltage pulse 1518 is provided to pathway P4 912 by P4 circuitry 928, in one embodiment.

The voltage difference between the steady state magnitude of voltage pulse 1512 and voltage pulse 1516 is referred to by double-sided arrow 1522, in FIG. 15B. The voltage difference between the steady state magnitude of voltage pulse 1512 and voltage pulse 1518 is referred to by double-sided arrow 1524, in FIG. 15B. These two voltage differences have different magnitudes in order to compensate for different impedances of the first pathway P1 906 and the second pathway P2 908, in one embodiment. Note that even though there are voltage differences 1522, 1524 in FIG. 15B, the GIDL voltages (Vgidl_d, Vgidl_s) in FIG. 15A have substantially the same magnitude.

Note that graph of voltage pulses in FIG. 15B could apply to memory operations other than a two-sided GIDL erase. For example, these voltage pulses could be applied during an erase that is not a GIDL erase. Also, the voltage pulses could be applied during memory array operations such as program or read. Thus, the voltage pulses in FIG. 15B could be applied to the pathways in one embodiment of FIG. 13B.

Figure 16:
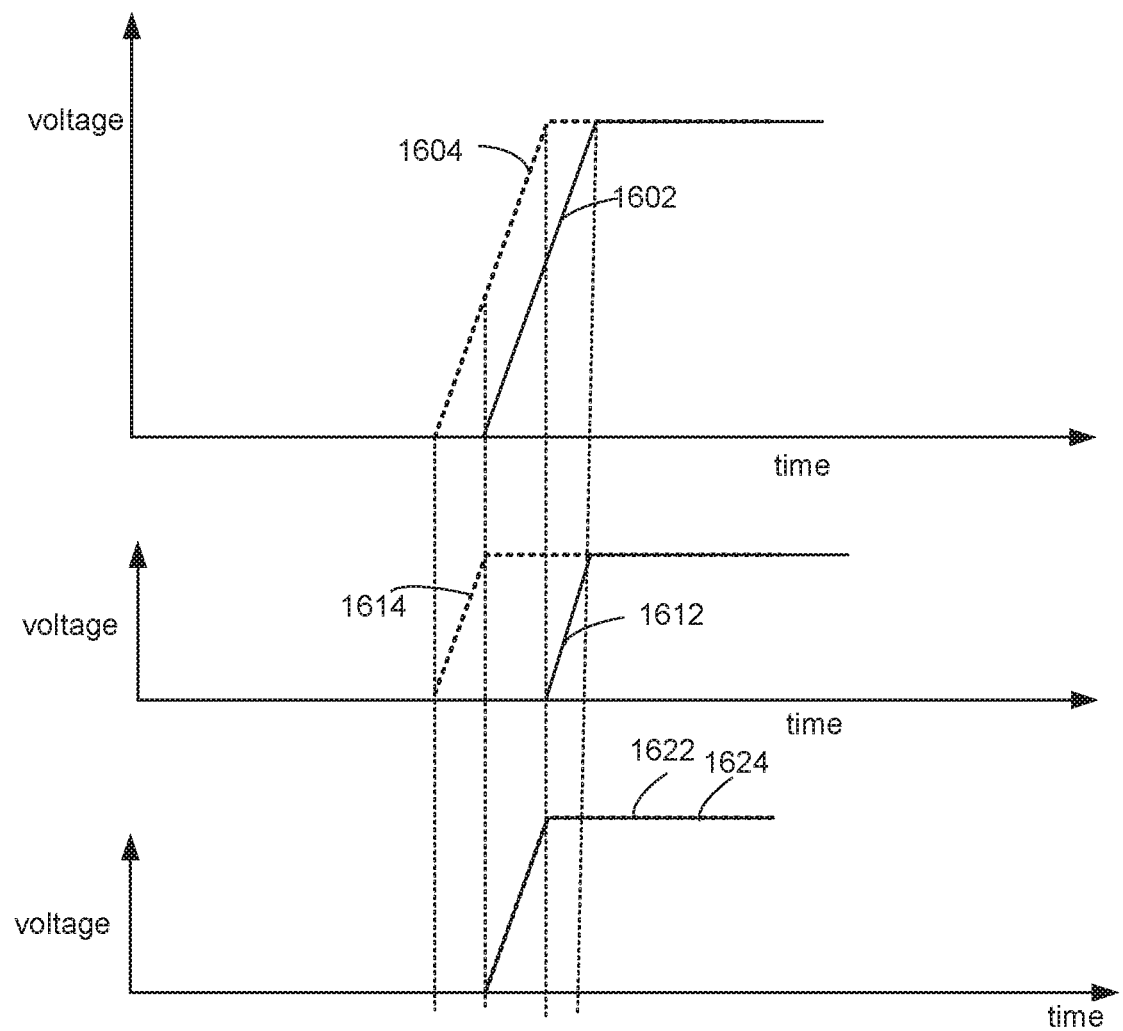
FIG. 16 depicts voltage pulses that occur at the select transistors in one embodiment of a two-sided GIDL erase.

FIG. 16 depicts voltage pulses that occur at the select transistors in one embodiment of a two-sided GIDL erase. The voltage pulses occur in one embodiment of operation of the circuit of FIG. 13A. Voltage pulse 1602 is the voltage V_pxd at one terminal (e.g., drain) of the first select transistor 680. Voltage pulse 1604 is the voltage V_pxs at one terminal (e.g., drain) of the second select transistor 670. Note voltage pulses 1602 and 1604 have different start times. This may be due to the different impedances (or impedance mismatch) between the first pathway P1 906 and the second pathway P2 908. Note that both of these voltage pulses may result due to V_Pxa (as well as V_Pxb).

Voltage pulse 1612 is the voltage at the gate terminal of the first select transistor 680. Voltage pulse 1614 is the voltage the gate terminal of the second select transistor 670. Note voltage pulses 1612 and 1614 have different start times. The differences in these start times is due at least in part to differences in start times of voltages applied to the SGD select line and the SGS select line. For example, the differences in these start times is due at least in part to differences in start times of voltages applied to pathway P3 910 and pathway P4 912.

Voltage pulse 1622 (solid line) is the voltage Vgidl_d between the drain and gate terminals of the first select transistor 680. Voltage pulse 1624 (dotted line) is the voltage Vgidl_s between the drain and gate terminals of the second select transistor 670. Voltage pulses 1622 and 1624 are substantially symmetric. The steady state magnitudes of voltage pulses 1622 and 1624 are substantially the same. The start times of voltage pulses 1622 and 1624 occur at substantially the same time. The first ramp times of voltage pulses 1622 and 1624 are substantially the same.

In the example of FIG. 16, the first ramp times of voltage pulses 1602 and 1604 may be substantially the same, but it is not required that the first ramp times be substantially the same. In the event that the first ramp times are not substantially the same, an adjustment can be made to the first ramp time of voltage pulse 1612 and/or 1614 to compensate such that the voltage pulses 1622 and 1624 are substantially symmetric.

Note that graph of voltage pulses in FIG. 16 could occur at the select transistors during memory operations other than a two-sided GIDL erase. For example, these voltage pulses could occur during an erase that is not a GIDL erase. Also, the voltage pulses could occur during memory array operations such as program or read. Thus, the voltage pulses in FIG. 16 could occur at the select transistors in one embodiment of FIG. 13B.

Figure 17:
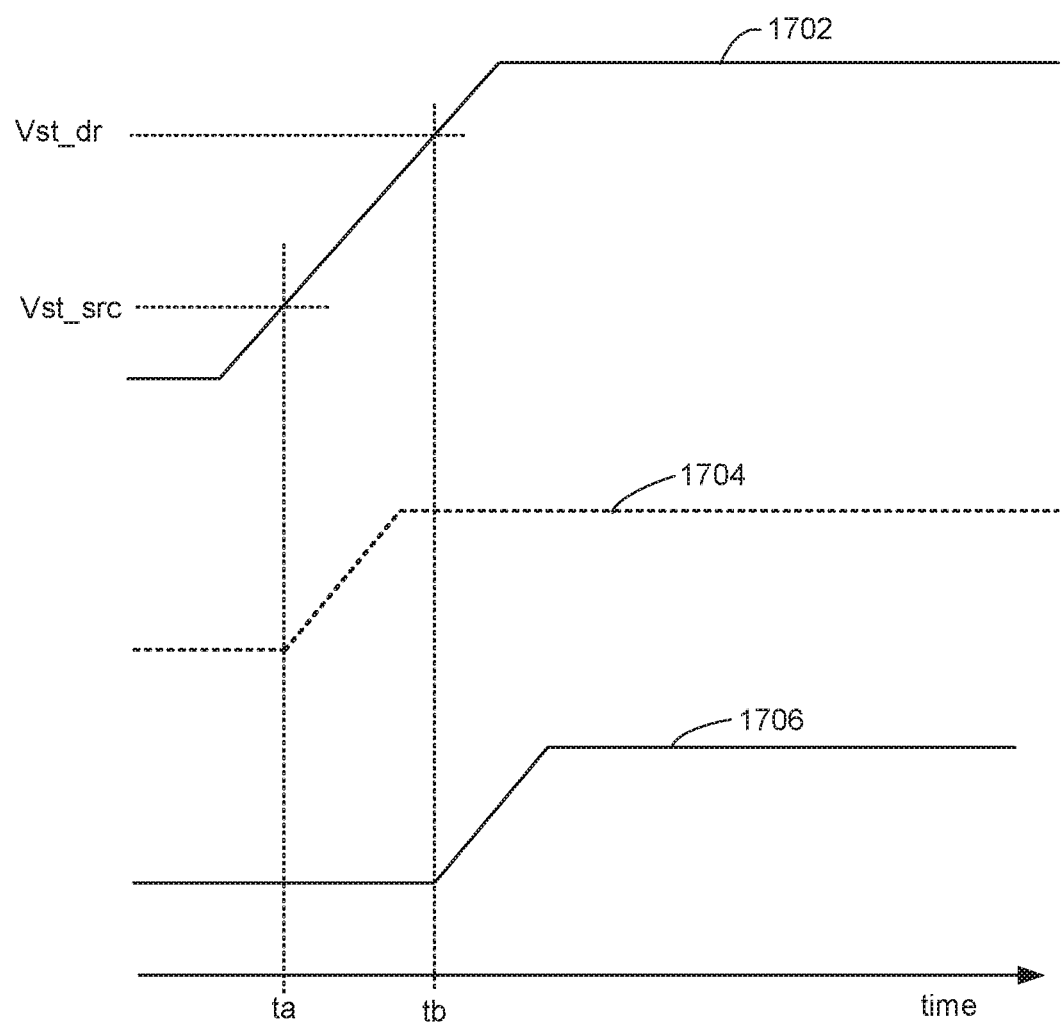
FIG. 17 is a diagram of voltage pulses that are applied to various pathways in one embodiment of a two-sided GIDL erase.

FIG. 17 is a diagram of voltage pulses that are applied to various pathways in one embodiment of a two-sided GIDL erase. The diagram is used to illustrate a technique for timing the starting of the voltages on the SGS and SGD select lines, in one embodiment. Voltage pulse 1702 is applied to both the first pathway P1 906 and the second pathway P2 908. P2 circuitry 924 applies the voltage pulse 1702 to section 906*a* (see FIG. 13A), in one embodiment. Therefore, the voltage pulse 1702 will travel along pathway 906 to select transistor 680, and also along pathway 908 to select transistor 670. As noted herein, pathway 906 and pathway 908 may have different impedances. Thus, there may be substantial differences between the voltages at the drain terminals of the select transistors 680, 670. For example, the voltages at the drain terminals of the select transistors 680, 670 may start at different times, as in voltage pulses 1602 and 1604 of FIG. 16.

Voltage pulse 1704 represents the voltage applied to the SGS select line. Voltage pulse 1704 is applied to pathway P4 912 by P4 circuitry 928, in one embodiment. Voltage pulse 1704 starts at time ta, which corresponds to the point at which voltage pulse 1702 reaches a magnitude of Vst_src.

Voltage pulse 1706 represents the voltage applied to the SGD select line. Voltage pulse 1706 is applied to pathway P3 910 by P3 circuitry 926, in one embodiment. Voltage pulse 1706 starts at time tb, which corresponds to the point at which voltage pulse 1702 reaches a magnitude of Vst_dr.

The technique for starting the voltage pulse 1704 may be used to control the timing of the voltage pulse output by P3 circuitry 926 of FIG. 14A. The technique for starting the voltage pulse 1706 may be used to control the timing of the voltage pulse output by P4 circuitry 928 of FIG. 14B.

The technique for starting the voltage pulses 1704 and 1706 that is shown in FIG. 17 may be used to result in voltage pulses 1612 and 1614 (see FIG. 16) at the control gate terminals of the select transistors 680, 670. Thus, the technique for starting the voltage pulses 1704 and 1706 that is shown in FIG. 17 may result in voltage pulses 1622 and 1624 being substantially symmetric.

Figure 18:
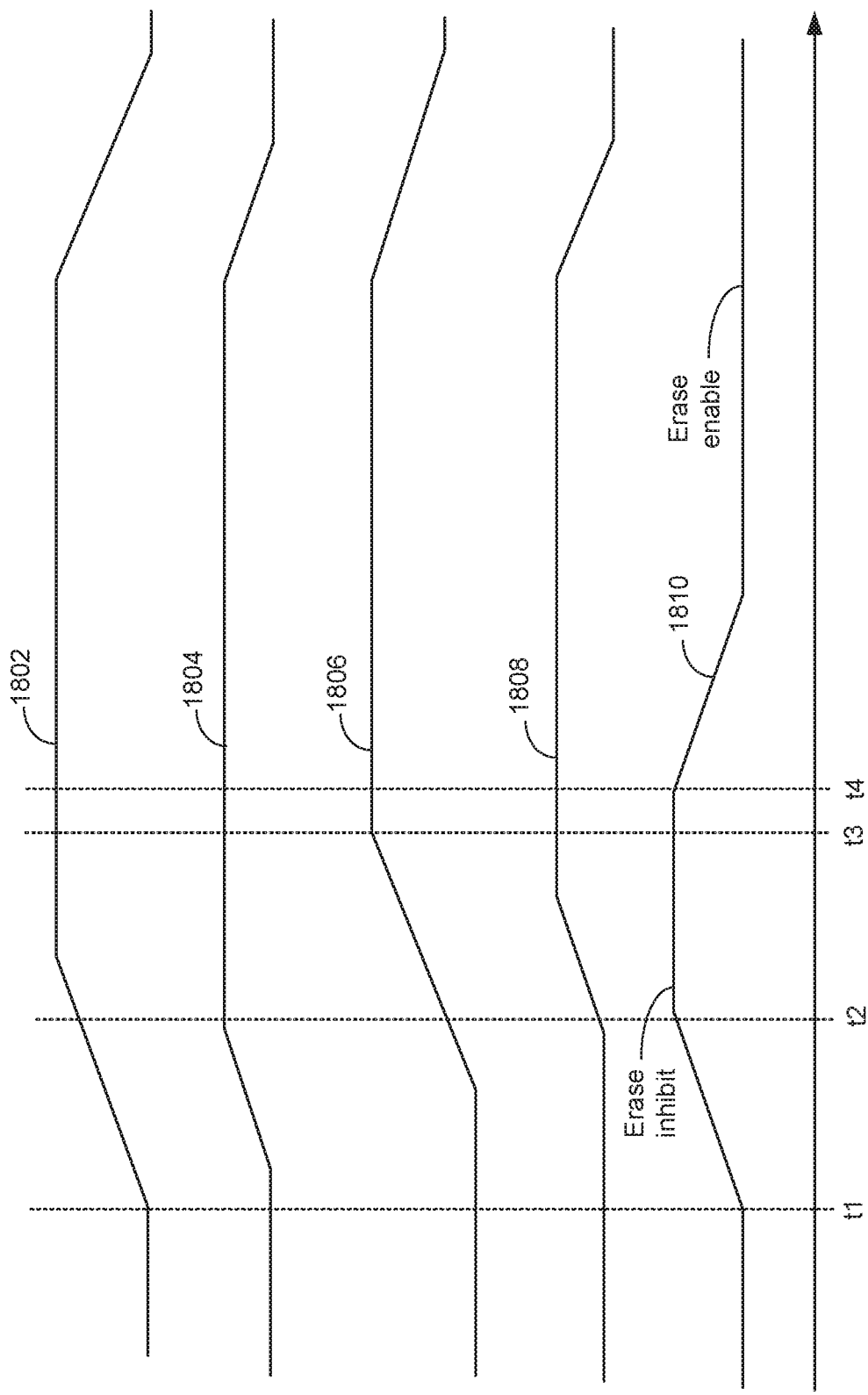
FIG. 18 shows voltage pulses of one embodiment of a two-sided GIDL erase.

FIG. 18 shows voltage pulses of one embodiment of a two-sided GIDL erase. Voltage pulses for voltages at the drain and gate terminals of the select transistors 680, 670 are depicted. Voltage pulse 1802 is the voltage at the drain terminal of the first select transistor 680. With reference to FIG. 9A, voltage pulse 1802 represents V_P1*b*. Voltage pulse 1804 is the voltage at the gate terminal of the first select transistor 680. With reference to FIG. 9A, voltage pulse 1804 represents V_P3*b*. Voltage pulse 1806 is the voltage at the drain terminal of the second select transistor 670. With reference to FIG. 9A, voltage pulse 1806 represents V_P2*b*. Voltage pulse 1808 is the voltage at the gate terminal of the second select transistor 670. With reference to FIG. 9A, voltage pulse 1808 represents V_P4*b*.

Voltage pulse 1810 is a voltage at the control gates of the memory cells of the NAND string. In this embodiment, the voltage on the control gates of memory cells is raised to an erase inhibit voltage while other voltage pulses 1802-1818 are transient. At time t1, voltage pulses 1802 and 1810 begin to rise. At time t2, the voltage pulse 1810 at the control gates of the memory cells has reached the erase inhibit voltage. The erase inhibit voltage has a sufficiently high magnitude such that even if the NAND string channel has been charged up by the GIDL current, erase of the memory cells is inhibited. Note that even at lower memory cell control gate voltages erase may be inhibited. By time t3 all of voltage pulses 1802-1808 have reached their steady state values. At time t4 (after all of voltage pulses 1802-1808 have reached their steady state values), voltage pulse 1810 begins to fall to an "erase enable voltage." The erase enable voltage has a sufficiently low magnitude such that if the NAND string channel has been charged up by the GIDL current, erase of the memory cells is enabled.

Therefore, the control gates of the memory cells are not reduced below the erase inhibit voltage until all of the voltage pulses 1802-1808 have reached their steady state values. Therefore, the memory cells will not begin to erase until the first transient period for all of the voltages (1802, 1804, 1806, 1808) is over. This eliminates possible negative effects that could occur during the first transient periods of voltages (1802, 1804, 1806, 1808). Therefore, this eliminates possible negative effects that could occur due to asymmetries between transient GIDL voltages and/or transient GIDL currents at each end of the NAND string.

Figure 19:
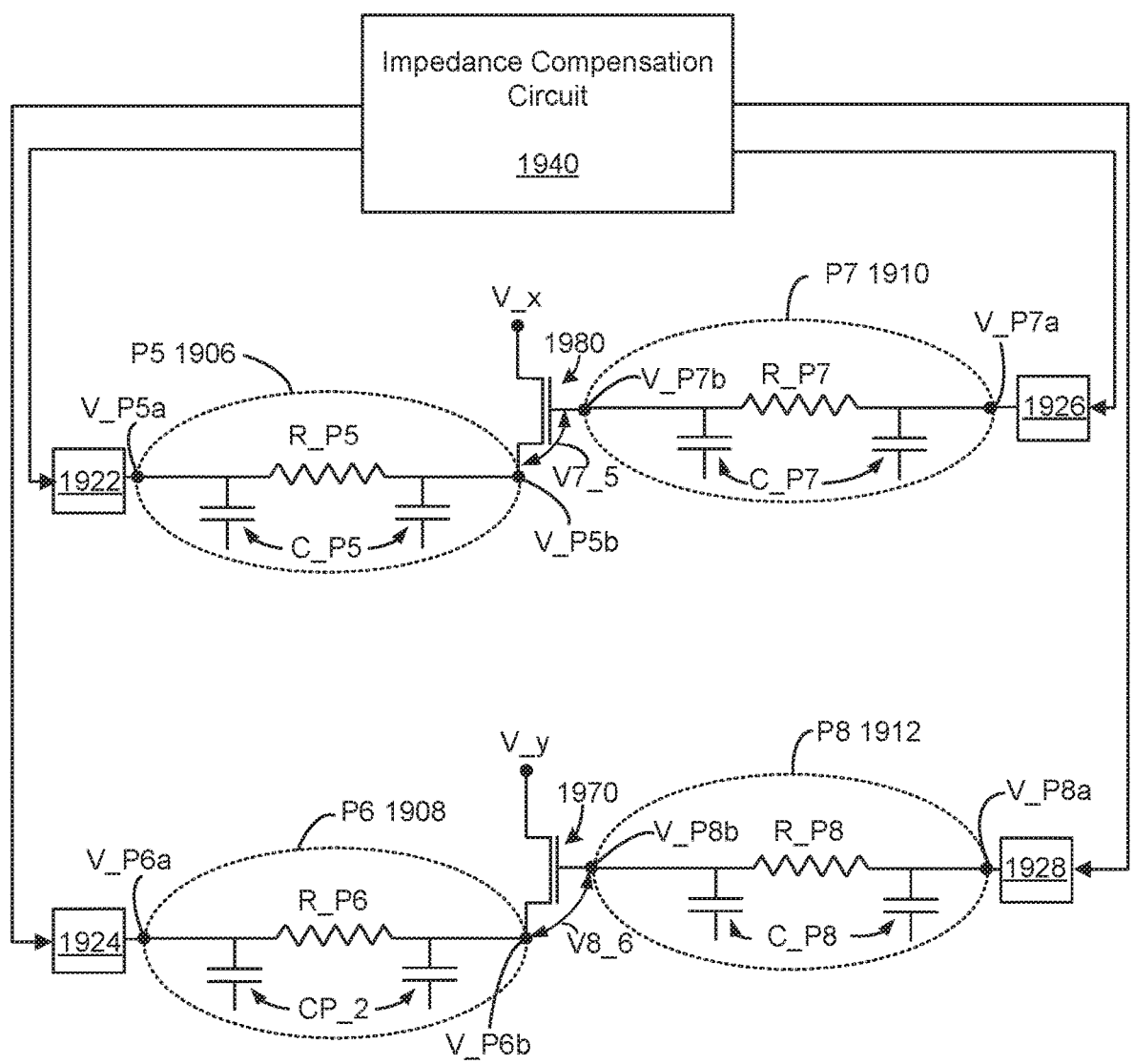
FIG. 19 is a diagram of one embodiment of an apparatus that is configured to compensate for impedance differences between pathways.

FIG. 19 is a diagram of one embodiment of an apparatus 1900 that is configured to compensate for impedance differences between pathways. The apparatus 1900 includes an impedance compensation circuit 1940, P5 circuitry 1922, P6 circuitry 1924, P7 circuitry 1926, and P8 circuitry 1928. The apparatus 1900 also includes a number of pathways P5 1906, P6 1908, P7 1910, and P8 1912. In one embodiment, apparatus 1900 is part of memory system 100. The transistors 1970, 1980 reside in memory structure 126, in one embodiment. The transistors 1970, 1980 are select transistors on a NAND string, in one embodiment. For example, transistor 1980 could be a drain side select transistor (e.g., transistor 680), and transistor 1970 could be a source side select transistor (e.g., transistor 670). However, the transistors 1970, 1980 are not required to be select transistors on a NAND string. The transistors 1970, 1980 are not required to be part of a NAND string.

Pathway P5 1906 is connected to one terminal (e.g., source or drain terminal) of transistor 1980. Pathway P5 1906 has an impedance, which is represented by resistance (R_P5) and a capacitance (C_P5). Pathway P6 1908 is connected to one terminal (e.g., source or drain terminal) of transistor 1970. Pathway P6 1908 has an impedance, which is represented by resistance (R_P6) and a capacitance (C_P6).

Pathway P7 1910 is connected to one terminal (e.g., gate terminal) of transistor 1980. Pathway P7 1910 has an impedance, which is represented by resistance (R_P7) and a capacitance (C_P7). Pathway P8 1912 is connected to one terminal (e.g., gate terminal) of transistor 1970. Pathway P8 1912 has an impedance, which is represented by resistance (R_P8) and a capacitance (C_P8).

P5 circuitry 1922 is configured to apply a voltage pulse V_P5$a$ to one end of pathway P5 1906. P5 circuitry 1922 may comprise any electrical components that are capable of providing a voltage. The voltage is relative to some common point, such as ground. P5 circuitry 1922 includes one or more charge pumps, in one embodiment. Due to the impedance of pathway P5 1906, there may be an RC delay along the pathway P5 1906. Due to the impedance of pathway P5 1906, there may be a voltage drop along the pathway P5 1906. The voltage pulse is referred to as V_P5$b$ at the other end of the pathway P5 1906 to indicate the possible delay and/or change in magnitude.

P6 circuitry 1924 is configured to apply a voltage pulse V_P6$a$ to one end of pathway P6 1908. P6 circuitry 1924 may comprise any electrical components that are capable of providing a voltage. The voltage is relative to some common point, such as ground. P6 circuitry 1924 includes one or more charge pumps, in one embodiment. Due to the impedance of pathway P6 1908, there may be an RC delay along the pathway P6 1908. Due to the impedance of pathway P6 1908, there may be a voltage drop along the pathway P6 1908. The voltage pulse is referred to as V_P6$b$ at the other end of the pathway P6 1908 to indicate the possible RC delay and/or change in magnitude.

P7 circuitry 1926 is configured to apply a voltage pulse V_P7$a$ to one end of pathway P7 1910. P7 circuitry 1926 may comprise any electrical components that are capable of providing a voltage. The voltage is relative to some common point, such as ground. P7 circuitry 1926 includes one or more charge pumps, in one embodiment. Due to the impedance of pathway P7 1910, there may be an RC delay along the pathway P7 191. Due to the impedance of pathway P7 1910, there may be a voltage drop along the pathway P7 1910. The voltage pulse is referred to as V_P7$b$ at the other end of the pathway P7 1910 to indicate the possible RC delay and/or change in magnitude.

P8 circuitry 1928 is configured to apply a voltage pulse V_P6$a$ to one end of pathway P8 1912. P8 circuitry 1928 may comprise any electrical components that are capable of providing a voltage. The voltage is relative to some common point, such as ground. P8 circuitry 1928 includes one or more charge pumps, in one embodiment. Due to the impedance of pathway P8 1912, there may be an RC delay along the pathway P8 1912. Due to the impedance of pathway P8 1912, there may be a voltage drop along the pathway P8 1912. The voltage pulse is referred to as V_P8$b$ at the other end of the pathway P8 1912 to indicate the possible RC delay and/or change in magnitude.

Therefore, voltage V_P5$b$ is applied to one terminal (e.g., drain or source) of transistor 1980, with voltage V_P7$b$ is applied to another terminal (e.g., gate) of transistor 1980, in one embodiment. The difference V_P7$b$-V_P5$b$ is referred to as V7_5. The voltage V_x appears at the other terminal (e.g., source or drain) of transistor 1980. In one embodiment, V_x is greater than V_P5$b$. In one embodiment, V_x is less than V_P5$b$.

Therefore, voltage V_P6$b$ is applied to one terminal (e.g., drain or source) of transistor 1970, with voltage V_P8$b$ is applied to another terminal (e.g., gate) of transistor 1970, in one embodiment. The difference V_P8$b$-V_P6$b$ is referred to as V8_6. The voltage V_y appears at the other terminal (e.g., source or drain) of transistor 1970. In one embodiment, V_y has the same magnitude as V_x. However, V_y and V_x are not required to have the same magnitude. In one embodiment, V_y is greater than V_P6$b$. In one embodiment, V_y is less than V_P7$b$.

In one embodiment, transistors 1980, 1970 are select transistors for a group of memory cells, such as a NAND string. In one embodiment, pathway P5 1906 includes a bit line, and pathway P6 1908 includes a source line. The voltages V_x and V_y are the voltages that appear at the respective terminals of transistors 1980, 1970 as a result of voltages applied to pathway P5 1906, pathway P6 1908, pathway P7 1910, pathway P8 1912, and the control gates of memory cells in the group of memory cells, such as a NAND string, in one embodiment.

However, transistors 1980, 1970 are not required to be select transistors for a group (e.g., NAND string) of memory cells. In one embodiment, the voltages V_x and V_y are applied to the respective terminals of transistors 1980, 1970 by a control circuit. In one embodiment, a control circuit applies voltages V_x and V_y to drain terminals of transistors 1980, 1970. In one embodiment, a control circuit applies voltages V_x and V_y to source terminals of transistors 1980, 1970.

The impedance compensation circuit 1940 is configured to cause P5 circuitry 1922, P6 circuitry 1924, P7 circuitry 1926, and P8 circuitry 1928 to apply voltage pulses to the respective pathways P5 1906, P6 1908, P7 1910, and P8 1912. In one embodiment, the impedance of pathway P5 1906 is different from the impedance of pathway P6 1908, and the impedance compensation circuit 1940 causes P7 circuitry 1926 and P8 circuitry 1928 to apply voltage pulses to pathways P7 1910 and P8 1912 to compensate for the different impedance of pathways P5 1906 and P6 1908. In one embodiment, the impedance of pathway P7 1910 is different from the impedance of pathway P8 1912, and the impedance compensation circuit 1940 causes P5 circuitry 1922 and P6 circuitry 1924 to apply voltage pulses to pathways P5 1906 and P6 1908 to compensate for the different impedance of pathways P7 1910 and P8 1912.

In one embodiment, the impedance compensation circuit 1940 is configured to cause P5 circuitry 1922 to apply a first voltage pulse (e.g., V_P5$a$) to pathway P5 1906; while causing P7 circuitry 1926 to apply a second voltage pulse (e.g., V_P7$a$) to pathway P7 1910, while causing P6 circuitry 1924 to apply a third voltage pulse (e.g., V_P6$a$) to pathway P6 1908, and while causing P8 circuitry 1928 to apply a fourth voltage pulse (e.g., V_8$a$) to pathway P8 1912.

The second voltage pulse and fourth voltage pulses have voltage pulse attributes that compensate for different impedances of pathway P5 1906 and pathway P6 1908, in one embodiment. The second voltage pulse has a first value for a voltage pulse attribute, and the fourth voltage pulse has a second value for the voltage pulse attribute, in one embodiment. The first value and the second value are different to compensate for different impedances of the pathway P5 1906 and pathway P6 1908, in one embodiment.

The voltage pulse attribute is a steady state magnitude, in one embodiment. Thus, the second voltage pulse and fourth voltage pulse have different steady state magnitudes, in one embodiment. The voltage pulse attribute is a start time, in one embodiment. Thus, the second voltage pulse and fourth voltage pulse have different start times, in one embodiment. In one embodiment, the second voltage pulse and fourth voltage pulse have different start times and different steady state magnitudes.

The first voltage pulse and third voltage pulses have voltage pulse attributes that compensate for different impedances of pathway P7 1910 and pathway P8 1912, in one embodiment. The first voltage pulse has a first value for a voltage pulse attribute, and the third voltage pulse has a second value for the voltage pulse attribute, in one embodiment. The first value and the second value are different to compensate for different impedances of pathway P7 1910 and pathway P8 1912, in one embodiment.

The voltage pulse attribute is a steady state magnitude, in one embodiment. Thus, the first voltage pulse and third voltage pulses have different steady state magnitudes, in one embodiment. The voltage pulse attribute is a start time, in one embodiment. Thus, the first voltage pulse and third voltage pulses have different start times, in one embodiment. In one embodiment, the first voltage pulse and third voltage pulses have different start times and different steady state magnitudes.

The impedance compensation circuit 1940 can include hardware only or a combination of hardware and software (including firmware). For example, a controller programmed by firmware to perform the functions described herein is one example of an impedance compensation circuit 1940. An impedance compensation circuit 1940 can include a processor, PGA (Programmable Gate Array), FPGA (Field Programmable Gate Array), ASIC (Application Specific Integrated Circuit), integrated circuit or other type of circuit. The impedance compensation circuit 1940 may include state machine 112. P5 circuitry 1922, P6 circuitry 1924, P7 circuitry 1926, and P8 circuitry 1928 may be part of power control circuit 116, which may execute under control of the state machine 112.

FIG. 20 is a flowchart of one embodiment of a process 2000 of mitigating for impedance mismatch between pathways. Process 2000 is performed by impedance mismatch circuit 1940, in one embodiment. Process 2000 may be used to compensate for impedance mismatch between pathway P1 906 and pathway P2 908 in FIG. 9A, FIG. 9B, FIG. 13A, or FIG. 13B. Process 2000 is used to compensate for impedance mismatch between pathway P3 910 and pathway P4 912 in FIG. 9A, FIG. 9B, FIG. 13A, or FIG. 13B. Process 2000 is used to compensate for impedance mismatch between pathway P5 1906 and pathway P6 1908 in FIG. 19, in one embodiment. Process 2000 is used to compensate for impedance mismatch between pathway P7 1910 and pathway P8 1912 in FIG. 19, in one embodiment.

Step 2002 includes applying voltages having substantially the same magnitude to first and second pathways. The first and second pathways have different impedances. The first pathway is connected to a first terminal of a first transistor (e.g., transistor 680 or 1980). The second pathway is connected to a first terminal of a second transistor (e.g., transistor 670 or 1970). In one embodiment, the first pathway is pathway P1 906, the second pathway is pathway P2 908, the third pathway (see step 2004) is pathway P3 910, and the fourth pathway (see step 2004) is pathway P4 912. In one embodiment, the first pathway is pathway P3 910, the second pathway is pathway P4 912, the third pathway (see step 2004) is pathway P1 906, and the fourth pathway (see step 2004) is pathway P2 908. In one embodiment, the first pathway is pathway P5 1906, the second pathway is pathway P6 1908, the third pathway (see step 2004) is pathway P7 1910, and the fourth pathway (see step 2004) is pathway P8 1912. In one embodiment, the first pathway is pathway P7 1910 and the second pathway is pathway P8 1912, the third pathway (see step 2004) is pathway P5 1906, and the fourth pathway (see step 2004) is pathway P6 1908. However, due to an impedance mismatch between the first and second pathways, the voltages have different magnitudes at the respective first terminals of the first transistor.

In one embodiment, the voltages are voltage pulses, in which case the steady state magnitudes of the voltages applied to the first and second pathways have substantially the same magnitude. With reference to FIG. 15B, voltage pulse 1512 is applied to both the first and second pathways, in one embodiment. As noted, due to an impedance mismatch between the first and second pathways, the voltages have different magnitudes at the respective first terminals of the first transistor and the second transistor. For example, with reference to FIG. 15A, voltage pulse 1502 is the voltage at the first terminal of the first select transistor (provided by the first pathway), and voltage pulse 1504 is the voltage at the first terminal of the second select transistor (provided by the second pathway).

Step 2004 includes applying voltages having different magnitudes to third and fourth pathways. The third pathway is connected to a second terminal of the first transistor (e.g., transistor 680 or 1980). The fourth pathway is connected to a second terminal of the second transistor (e.g., transistor 670 or 1970). The combination of voltages applied to the four pathways results a first voltage between the first and second terminals of the first transistor, and second voltage between the first and second terminals of the second transistor. The first voltage and the second voltage have substantially the same magnitude, in one embodiment.

In one embodiment, with reference to FIG. 12A, voltage pulse 1202a is applied to the third pathway, and voltage pulse 1204a is applied to the fourth pathway. In one embodiment, with reference to FIG. 15B, voltage pulse 1516 is applied to the third pathway, and voltage pulse 1518 is applied to the fourth pathway.

The third and fourth pathways could have the same impedance, but this is not required. Regardless of whether or not the third and fourth pathways have the same impedance, the voltages that arrive at the respective second terminals of the first and second transistors have different magnitudes. The different magnitudes compensate for different magnitudes of voltages at the first terminals of the first and second transistors. For example, with reference to FIG. 15A, voltage pulse 1506 is the voltage at the second terminal of the first select transistor (provided by the third pathway), and voltage pulse 1508 is the voltage at the second terminal of the second select transistor (provided by the fourth pathway).

Applying voltages to the first, the second, the third, and the fourth pathways results in substantially the same magnitude voltage between the first and the second terminals of the first transistor and between the first and the second terminals of the second transistor. For example, with reference to FIG. 19, the voltage that is marked V7_5 has substantially the same magnitude as the voltage that is marked V8_6.

FIG. 21 is a flowchart of one embodiment of a process 2100 of mitigating for impedance mismatch between pathways. Process 2100 is performed by impedance mismatch circuit 1940, in one embodiment. Process 2100 may be used to compensate for impedance mismatch between pathway P1 906 and pathway P2 908 in FIG. 9A, FIG. 9B, FIG. 13A, or FIG. 13B. Process 2100 is used to compensate for impedance mismatch between pathway P3 910 and pathway P4 912 in FIG. 9A, FIG. 9B, FIG. 13A, or FIG. 13B. Process 2100 is used to compensate for impedance mismatch between pathway P5 1906 and pathway P6 1908 in FIG. 19, in one embodiment. Process 2100 is used to compensate for impedance mismatch between pathway P7 1910 and pathway P8 1912 in FIG. 19, in one embodiment.

Step 2102 includes applying substantially symmetric voltage pulses to first and second pathways that results in asymmetric voltage pulses at respective first terminals of first and second transistors. The first and second pathways have different impedances. The first pathway is connected to a first terminal of a first transistor (e.g., transistor 680 or 1980). The second pathway is connected to a first terminal of a second transistor (e.g., transistor 670 or 1970). In one embodiment, the first pathway is pathway P1 906, the second pathway is pathway P2 908, the third pathway (see step 2104) is pathway P3 910, and the fourth pathway (see step 2104) is pathway P4 912. In one embodiment, the first pathway is pathway P3 910, the second pathway is pathway P4 912, the third pathway (see step 2004) is pathway P1 906, and the fourth pathway (see step 2104) is pathway P2 908. In one embodiment, the first pathway is pathway P5 1906, the second pathway is pathway P6 1908, the third pathway (see step 2104) is pathway P7 1910, and the fourth pathway (see step 2004) is pathway P8 1912. In one embodiment, the first pathway is pathway P7 1910 and the second pathway is pathway P8 1912, the third pathway (see step 2104) is pathway P5 1906, and the fourth pathway (see step 2104) is pathway P6 1908. However, due to an impedance mismatch between the first and second pathways, the voltage pulses are asymmetric at the respective first terminals of the first transistor.

With reference to FIG. 15B, voltage pulse 1512 is applied to both the first and second pathways, in one embodiment. As noted, due to an impedance mismatch between the first and second pathways, the voltage pulses are asymmetric at the respective first terminals of the first transistor. For example, with reference to FIG. 15A, voltage pulse 1502 is the voltage at the first terminal of the first select transistor (provided by the first pathway), and voltage pulse 1504 is the voltage at the first terminal of the second select transistor (provided by the second pathway).

Step 2104 includes applying asymmetric voltage pulses to third and fourth pathways. The third pathway is connected to a second terminal of the first transistor (e.g., transistor 680 or 1980). The fourth pathway is connected to a second terminal of the second transistor (e.g., transistor 670 or 1970). In one embodiment, with reference to FIG. 12A, voltage pulse 1202a is applied to the third pathway, and voltage pulse 1204a is applied to the fourth pathway. In one embodiment, with reference to FIG. 15B, voltage pulse 1516 is applied to the third pathway, and voltage pulse 1518 is applied to the fourth pathway. In one embodiment, the asymmetry includes different steady state magnitudes. In one embodiment, the asymmetry includes different start times. In one embodiment, the asymmetry includes different start times and different steady state magnitudes.

In one embodiment, the voltage pulses in step 2104 do not have substantially the same steady state voltage magnitudes. In one embodiment, the difference in voltage magnitudes of the voltage pulses in step 2104 for at least one point in time during the first transient period of either of the two voltages is more than 3% of the larger steady state magnitude of the two voltages.

The third and fourth pathways could have the same impedance, but this is not required. Regardless of whether or not the third and fourth pathways have the same impedance, the voltage pulses that arrive at the respective second terminals of the first and second transistors are asymmetric, in one embodiment. For example, with reference to FIG. 15A, voltage pulse 1506 is the voltage at the second terminal of the first select transistor (provided by the third pathway), and voltage pulse 1508 is the voltage at the second terminal of the second select transistor (provided by the fourth pathway).

The asymmetry of the voltage pulses applied to the third and fourth pathways compensates for the asymmetry of voltage pulses at the first terminals of the first and second transistors. In one embodiment, the asymmetry compensates for different steady state magnitudes of the voltage pulses at the first terminals of the first and second transistors. In one embodiment, the asymmetry compensates for different start times of the voltage pulses at the first terminals of the first and second transistors. In one embodiment, the asymmetry compensates for different start times and different steady state magnitudes of the voltage pulses at the first terminals of the first and second transistors.

The combination of voltages applied to the four pathways results a voltage pulse between the first and second terminals of the first transistor, and voltage pulse between the first and second terminals of the second transistor, in one embodiment. For example, with reference to FIG. 19, the voltage $V7\_5$ represents one voltage pulse and the voltage that is marked $V8\_6$ represents another voltage pulse. These two voltage pulses have substantially the same steady state magnitude, in one embodiment. These two voltage pulses are substantially symmetric, in one embodiment.

In one embodiment, the combination of voltages applied to the four pathways may result a first voltage difference waveform between the first and second terminals of the first transistor, and second voltage difference waveform between the first and second terminals of the second transistor. The voltage difference waveforms could be voltage pulses, but are not required to be voltage pulses, as the term voltage pulse is defined herein. Each voltage difference waveform has a steady state magnitude, in one embodiment. The steady state magnitude refers to the magnitude when the voltage difference waveform is at a stable level. Although the voltage is relatively stable when at a steady state magnitude, there may be some small variations in the steady state magnitude due to, for example, noise or other non-ideal factors. The steady state magnitude of the voltage difference waveforms does not necessarily occur during the steady state periods of voltage pulses applied to the pathways. In one embodiment, the combination of voltages applied to the four pathways result in a first start time of the first voltage difference waveform and a second start time of the second voltage difference waveform occurring at substantially the same time.

A first embodiment includes and apparatus comprising a first transistor having a first terminal connected to a first end of a first pathway and a second terminal connected to a first end of a second pathway, a second transistor having a first terminal connected to a first end of a third pathway and a second terminal connected to a first end of a fourth pathway, and an impedance compensation circuit. The impedance compensation circuit is configured to apply a first voltage pulse to a second end of the first pathway, apply a second voltage pulse having a first value for a voltage pulse attribute to a second end of the second pathway, apply a third voltage pulse to a second end of the third pathway, and apply a fourth voltage pulse having a second value for the voltage pulse attribute to a second end of the fourth pathway. The first value and the second value are different to compensate for different impedances of the first pathway and the third pathway.

In a second embodiment in furtherance of the first embodiment, the second voltage pulse and the fourth voltage pulse have different steady state magnitudes at the respective second terminals of the first and the second transistors such that a first steady state magnitude of a first voltage difference waveform between the first and the second terminal of the first transistor and a second steady state magnitude of a second voltage difference waveform between the first terminal and the second terminal of the second transistor are substantially the same magnitude.

In a second embodiment in furtherance of the first or second embodiments, the second voltage pulse and the fourth voltage pulse have different start times at the respective second terminals of the first and the second transistors such that a first start time of a first voltage difference waveform between the first terminal and the second terminal of the first transistor and a second start time of a second voltage difference waveform between the first terminal and the second terminal of the second transistor occur at substantially the same time.

In a fourth embodiment in furtherance of any of the first to third embodiments, the apparatus further comprises non-volatile memory cells connected between the first transistor and the second transistor.

In a fifth embodiment in furtherance of the fourth embodiment, the first transistor is a first select transistor connected to a bit line, and the second transistor is a second select transistor connected to a source line.

In a sixth embodiment in furtherance of the fourth embodiment, the impedance compensation circuit is further configured to apply an erase enable voltage to control gates of the non-volatile memory cells while the first voltage pulse and the second voltage pulse are applied to the first transistor and while the third voltage pulse and the fourth voltage pulse are applied to the second transistor to erase the non-volatile memory cells.

In a seventh embodiment in furtherance of the fourth embodiment, the impedance compensation circuit is further configured to cause a first gate-induced drain leakage (GIDL) current by applying the first voltage pulse and the second voltage pulse to the first transistor; and cause a second gate-induced drain leakage (GIDL) current by applying the third voltage pulse and the fourth voltage pulse to the second transistor.

In an eighth embodiment in furtherance of any of the first to seventh embodiments: the first pathway comprises a bit line connected to the first terminal of the first transistor; the second pathway comprises a first select line connected to the second terminal of the first transistor; the third pathway comprises a source line connected to the first terminal of the second transistor; and the fourth pathway comprises a second select line connected to the second terminal of the second transistor.

In a ninth embodiment in furtherance of any of the first to eighth embodiments the first voltage pulse and the second voltage pulse are the same voltage pulse.

One embodiment includes a method comprising applying voltages having substantially the same magnitude to a first end of a first pathway and to a first end of a second pathway. The first pathway has a second end connected to a first terminal of a first transistor. The second pathway has a second end connected to a first terminal of a second transistor. The method also comprises applying voltages having different magnitudes to a first end of a third pathway and to a first end of a fourth pathway. The third pathway has a second end connected to a second terminal of the first transistor. The fourth pathway has a second end connected to a second terminal of the second transistor. Applying voltages to the first, the second, the third, and the fourth pathways results in substantially the same magnitude voltage between the first and the second terminals of the first transistor and between the first and the second terminals of the second transistor.

One embodiment includes a non-volatile storage device comprising: a NAND string of memory cells comprising a first select transistor having a first terminal connected to a first end of a first pathway and a second terminal connected to a first end of a second pathway, a second select transistor having a third terminal connected to a first end of a third pathway and a fourth terminal connected to a first end of a fourth pathway, and a plurality of non-volatile memory cells connected between the first select transistor and the second select transistor. The non-volatile storage device further comprises a control circuit configured to: apply substantially symmetric voltage pulses to a second end of the first pathway and a second end of the third pathway that result in asymmetric voltage pulses at the respective first terminals of the first select transistor and the second select transistor. The control circuit is further configured to apply asymmetric voltage pulses to a second end of the second pathway and to a second end of the fourth pathway that result in a voltage pulse between the first terminal and the second terminal of the first select transistor and a voltage pulse between the first terminal and the second terminal of the second select transistor having substantially the same steady state magnitude.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   a first transistor having a first terminal connected to a first end of a first pathway and a second terminal connected to a first end of a second pathway;
   a second transistor having a first terminal connected to a first end of a third pathway and a second terminal connected to a first end of a fourth pathway; and
   an impedance compensation circuit configured to:
      apply a first voltage pulse to a second end of the first pathway;
      apply a second voltage pulse having a first value for a voltage pulse attribute to a second end of the second pathway;
      apply a third voltage pulse to a second end of the third pathway; and
      apply a fourth voltage pulse having a second value for the voltage pulse attribute to a second end of the fourth pathway, the first value and the second value are different to compensate for different impedances of the first pathway and the third pathway.

2. The apparatus of claim 1, wherein the voltage pulse attribute is a steady state magnitude, wherein the second voltage pulse has a first steady state magnitude at the second end of the second pathway that is different from a second steady state magnitude of the fourth voltage pulse at the second end of the fourth pathway, wherein the second voltage pulse has a third steady state magnitude at the second terminal of the first transistor that is different from a fourth steady state magnitude of the fourth voltage pulse at the second terminal of the second transistor such that a fifth steady state magnitude of a first voltage difference waveform between the first and the second terminal of the first transistor and a sixth steady state magnitude of a second voltage difference waveform between the first terminal and the second terminal of the second transistor are substantially the same magnitude.

3. The apparatus of claim 1, wherein the voltage pulse attribute is a start time, wherein the second voltage pulse has a first start time at the second end of the second pathway that is different from a second start time of the fourth voltage pulse at the second end of the fourth pathway, wherein the second voltage pulse has a third start time at the second terminal of the first transistor that is different from a fourth start time at the second terminal of the second transistor such that a fifth start time of a first voltage difference waveform between the first terminal and the second terminal of the first transistor and a sixth start time of a second voltage difference waveform between the first terminal and the second terminal of the second transistor occur at substantially the same time.

4. The apparatus of claim 1, further comprising:
   non-volatile memory cells connected between the first transistor and the second transistor.

5. The apparatus of claim 4, wherein:
   the first pathway comprises a bit line;
   the second pathway comprises a source line;
   the first transistor is a first select transistor connected to the bit line; and
   the second transistor is a second select transistor connected to the source line.

6. The apparatus of claim 4, wherein the impedance compensation circuit is further configured to:
   apply an erase enable voltage to control gates of the non-volatile memory cells while the first voltage pulse and the second voltage pulse are applied to the first transistor and while the third voltage pulse and the fourth voltage pulse are applied to the second transistor to erase the non-volatile memory cells.

7. The apparatus of claim 4, wherein the impedance compensation circuit is further configured to:
   cause a first gate-induced drain leakage (GIDL) current by applying the first voltage pulse and the second voltage pulse to the first transistor; and
   cause a second gate-induced drain leakage (GIDL) current by applying the third voltage pulse and the fourth voltage pulse to the second transistor.

8. The apparatus of claim 1, wherein:
   the first pathway comprises a bit line connected to the first terminal of the first transistor;
   the second pathway comprises a first select line connected to the second terminal of the first transistor;
   the third pathway comprises a source line connected to the first terminal of the second transistor; and
   the fourth pathway comprises a second select line connected to the second terminal of the second transistor.

9. The apparatus of claim 1, wherein the first voltage pulse and the second voltage pulse are the same voltage pulse.

10. A method comprising:
    applying voltages having substantially the same magnitude to a first end of a first pathway and to a first end of a second pathway, the first pathway having a second end connected to a first terminal of a first transistor, the second pathway having a second end connected to a first terminal of a second transistor; and
    applying voltages having different magnitudes to a first end of a third pathway and to a first end of a fourth pathway, the third pathway having a second end connected to a second terminal of the first transistor, the fourth pathway having a second end connected to a second terminal of the second transistor, wherein applying voltages to the first, the second, the third, and the fourth pathways results in substantially the same magnitude voltage between the first and the second terminals of the first transistor and between the first and the second terminals of the second transistor.

11. The method of claim 10, wherein:
    applying the voltages having substantially the same magnitude to the first end of the first pathway and to the first end of the second pathway results in different magnitude voltages at the first terminals of the first transistor and the second transistor; and
    applying the voltages having different magnitudes to the first end of the third pathway and to the first end of the fourth pathway compensates for the different magnitude voltages at the first terminals of the first transistor and the second transistor.

12. The method of claim 10, wherein:
    the first pathway and the second pathway have different impedances; and
    applying the voltages having different magnitudes to the first end of the third pathway and to the first end of the fourth pathway compensates for the different impedances of the first pathway and the second pathway.

13. The method of claim 10, wherein applying the voltages having substantially the same magnitude to the first end of the first pathway and to the first end of the second pathway comprises:

applying substantially the same voltage at substantially the same time to the first end of the first pathway and to the first end of the second pathway.

14. The method of claim 10, wherein:

the first transistor comprises a first select transistor on a NAND string; and the second transistor comprises a second select transistor on the NAND string.

15. The method of claim 14, wherein:

applying the voltages having substantially the same magnitude to the first end of the first pathway and to the first end of the second pathway and applying the voltages having different magnitudes to the first end of the third pathway and to the first end of the fourth pathway creates a first gate-induced drain leakage (GIDL) voltage between a drain and a gate of the first select transistor and a second GIDL voltage between a drain and gate of the second select transistor, the first GIDL voltage and the second GIDL voltage have substantially the same magnitude.

16. A non-volatile storage device comprising:

a NAND string of memory cells comprising a first select transistor having a first terminal connected to a first end of a first pathway and a second terminal connected to a first end of a second pathway, a second select transistor having a first terminal connected to a first end of a third pathway and a second terminal connected to a first end of a fourth pathway, and a plurality of non-volatile memory cells connected between the first select transistor and the second select transistor; and a control circuit configured to:

apply substantially symmetric voltage pulses to a second end of the first pathway and a second end of the third pathway that result in asymmetric voltage pulses at the respective first terminals of the first select transistor and the second select transistor; and apply asymmetric voltage pulses to a second end of the second pathway and to a second end of the fourth pathway that result in a voltage pulse between the first terminal and the second terminal of the first select transistor and a voltage pulse between the first terminal and the second terminal of the second select transistor having substantially the same steady state magnitude.

17. The non-volatile storage device of claim 16, wherein:

the asymmetric voltage pulses applied to the second end of the second pathway and to the second end of the fourth pathway have different steady state magnitudes to compensate for different steady state magnitudes of the asymmetric voltage pulses at the first end of the first pathway and the first end of the third pathway.

18. The non-volatile storage device of claim 16, wherein:

the asymmetric voltage pulses applied to the second end of the second pathway and to the second end of the fourth pathway have different start times to compensate for different start times of the asymmetric voltage pulses at the first end of the first pathway and the first end of the third pathway.

19. The non-volatile storage device of claim 16, wherein:

the first pathway comprises a bit line connected to the first terminal of the first select transistor;

the second pathway comprises a select line connected to the second terminal of the first select transistor;

the third pathway comprises a source line connected to the first terminal of the second select transistor; and the fourth pathway comprises a select line connected to the second terminal of the second select transistor.

20. The non-volatile storage device of claim 19, wherein the control circuit is further configured to:

cause a first gate-induced drain leakage (GIDL) voltage between a drain and a gate of the first select transistor and a second GIDL voltage between a drain and a gate of the second select transistor by applying the substantially symmetric voltage pulses to the second end of the first pathway and the second end of the third pathway while applying the asymmetric voltage pulses to the second end of the second pathway and to the second end of the fourth pathway, wherein the first GIDL voltage and the second GIDL voltage have substantially the same magnitude.

* * * * *